(12) United States Patent
Kwok et al.

(10) Patent No.: US 10,381,564 B2
(45) Date of Patent: Aug. 13, 2019

(54) ORGANIC-INORGANIC PEROVSKITE MATERIALS AND OPTOELECTRONIC DEVICES FABRICATED BY CLOSE SPACE SUBLIMATION

(71) Applicant: The Hong Kong University of Science and Technology, Kowloon, Hong Kong (CN)

(72) Inventors: Hoi Sing Kwok, Hong Kong (CN); Guijun Li, Hong Kong (CN); Yeuk Lung Jacob Ho, Hong Kong (CN); Man Wong, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 0 days.

(21) Appl. No.: 15/753,519

(22) PCT Filed: Aug. 17, 2016

(86) PCT No.: PCT/US2016/047323
§ 371 (c)(1),
(2) Date: Feb. 19, 2018

(87) PCT Pub. No.: WO2017/031193
PCT Pub. Date: Feb. 23, 2017

(65) Prior Publication Data
US 2018/0248118 A1   Aug. 30, 2018

Related U.S. Application Data

(60) Provisional application No. 62/283,065, filed on Aug. 20, 2015.

(51) Int. Cl.
*H01L 51/00* (2006.01)
*H01L 51/42* (2006.01)
(Continued)

(52) U.S. Cl.
CPC ......... *H01L 51/001* (2013.01); *H01G 9/0029* (2013.01); *H01G 9/2004* (2013.01);
(Continued)

(58) Field of Classification Search
CPC ............... H01L 51/001; H01L 51/5032; H01L 51/5296; H01L 51/0077; H01L 51/4273; H01L 51/442; H01L 51/4226; H01L 51/0032; H01L 51/42; H01G 9/0029; H01G 9/2004; Y02E 10/549
USPC ........................................................ 257/40
See application file for complete search history.

(56) References Cited

U.S. PATENT DOCUMENTS 4,734,381 A  *  3/1988  Mitchell ................. H01L 21/44
                                                  136/256
5,871,579 A     2/1999  Liang et al.
(Continued)

FOREIGN PATENT DOCUMENTS

CN    103956325 A  *  7/2014
CN    103956325 A      7/2014
(Continued)

OTHER PUBLICATIONS

O'Brien, Shane, et al. "Zinc oxide thin films: Characterization and potential applications." Thin Solid Films 518.16 (2010): 4515-4519. (Year: 2010).*

(Continued)

*Primary Examiner* — Karen Kusumakar
*Assistant Examiner* — Adam S Bowen
(74) *Attorney, Agent, or Firm* — Osha Liang LLP

(57) ABSTRACT

A method of fabricating a hybrid organic-inorganic halide perovskite film includes depositing a precursor layer onto a substrate, the precursor layer comprising metal halide, placing an organic source-material layer onto a boat, the organic source-material layer comprising an organic cation, and annealing the precursor layer and the organic source-material layer in a vacuum chamber enclosed in a constrained volume.

13 Claims, 20 Drawing Sheets

(51) Int. Cl.
    H01G 9/00      (2006.01)
    H01G 9/20      (2006.01)
    H01L 51/44     (2006.01)
    H01L 51/50     (2006.01)
    H01L 51/52     (2006.01)

(52) U.S. Cl.
    CPC ...... *H01L 51/0032* (2013.01); *H01L 51/0077* (2013.01); *H01L 51/42* (2013.01); *H01L 51/4226* (2013.01); *H01L 51/4273* (2013.01); *H01L 51/442* (2013.01); *H01L 51/5032* (2013.01); *H01L 51/5296* (2013.01); *Y02E 10/549* (2013.01)

(56) References Cited

U.S. PATENT DOCUMENTS

| | | | |
|---|---|---|---|
| 2012/0040516 A1* | 2/2012 | Xia | C23C 14/228 438/478 |
| 2014/0332078 A1 | 11/2014 | Guo et al. | |
| 2015/0037955 A1* | 2/2015 | Son | H01L 27/1251 438/275 |
| 2015/0200377 A1 | 7/2015 | Etgar et al. | |
| 2015/0249170 A1* | 9/2015 | Snaith | H01L 51/422 136/256 |
| 2015/0311364 A1 | 10/2015 | Wu et al. | |
| 2016/0285021 A1* | 9/2016 | Yang | B05D 1/60 |

FOREIGN PATENT DOCUMENTS

| | | |
|---|---|---|
| CN | 104022185 A | 9/2014 |
| CN | 104485425 A | 4/2015 |
| WO | 2014045021 A1 | 3/2014 |
| WO | 2015036905 A1 | 3/2015 |
| WO | 2015116297 A2 | 8/2015 |

OTHER PUBLICATIONS

Chin, Xin Yu, et al. "Lead iodide perovskite light-emitting field-effect transistor." Nature communications 6 (2015): 7383. (Year: 2015).*

Chen, Qi et al. "Planar Heterojunction Perovskite Solar Cells via Vapor-Assisted Solution Process" J. Am. Chem. Soc., 2014, 136, 622-625 (4 pages).

Li, Yanbo et al. "Fabrication of Planar Heterojunction Perovskite Solar Cells by Controlled Low-Pressure Vapor Annealing" J. Phys. Chem. Lett. 2015, 6, 493-499 (7 pages).

Abbas, Hisham A. et al. "High efficiency sequentially vapor grown n-i-p CH3NH3PbI3 perovskite solar cellswith undoped P3HT as p-type heterojunction layer" APL Mater. 3, 016105 (2015) (8 pages).

Luo, Paifeng et al. "Uniform, Stable, and Efficient Planar-Heterojunction Perovskite Solar Cells by Facile Low-Pressure Chemical Vapor Deposition under Fully Open-Air Conditions" ACS Appl. Mater. Interfaces 2015, 7, 2708-2714 (7 pages).

Leyden, Matthew R. et al. "High performance perovskite solar cells by hybrid chemical vapor deposition" J. Mater. Chem. A, 2014, 2, 18742-18745 (4 pages).

Liu, Mingzhen et al. "Efficient planar heterojunction perovskite solar cells by vapour deposition" Sep. 9, 2013, vol. 501, Nature 395 (8 pages).

Li, Guijun et al. "Low cost, high throughputand centimeter-scale fabricationof efficient hybrid perovskite solar cellsby closed space vapor transport" 2016 WILEY-VCH Verlag GmbH & Co. KGaA, Weinheim (5 pages).

International Search Report issued in corresponding International Application No. PCT/US2016/047323 dated Feb. 23, 2016 (2 pages).

Chin, Xy et al. "Lead iodide perovskite light-emitting field-effect transistor" Nature Communications. Jun. 2015; abstract; p. 2, col. 2, 2nd paragraph; p. 3, col. 1, 1st paragraph; p. 5, col. 1, 2nd paragraph; figure 1d (9 pages).

O'Brien, S et al. "Zinc oxide thin films: Characterization and potential applications" Thin Solid Films. 2010; p. 4516. 2nd paragraph (6 pages).

Mitzi, D. B. et al. "Organic-inorganic electronics" IBM J. Res. Dev. 45, 29-45 (2001) (17 pages).

Office Action issued in corresponding Chinese Application No. 201680048733 dated Apr. 23, 2019, and English translation thereof (14 pages).

* cited by examiner

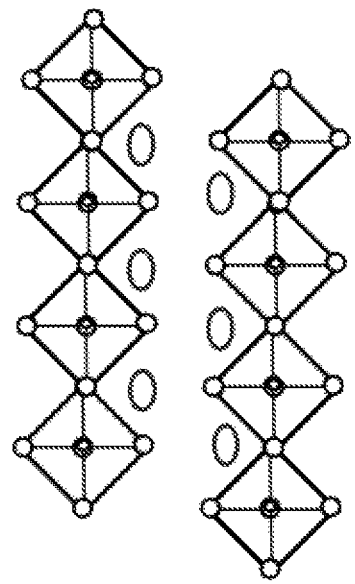
FIG.1(b) 2D perovskite $A_2MX_4$
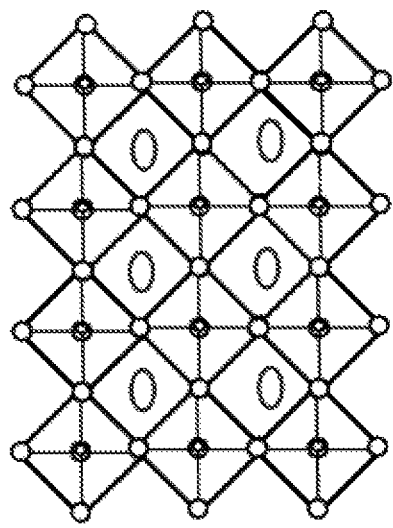
FIG.1(a) 3D perovskite $AMX_3$

ORGANIC-INORGANIC PEROVSKITE MATERIALS AND OPTOELECTRONIC DEVICES FABRICATED BY CLOSE SPACE SUBLIMATION

FIELD OF INVENTION

The present invention relates generally to a method of fabricating hybrid organic-inorganic halide perovskite films and hybrid organic-inorganic halide perovskite devices.

BACKGROUND OF INVENTION

A perovskite solar cell is a type of solar cell which includes a perovskite structured material, most commonly a hybrid organic-inorganic halide perovskite halide material, as a light-absorbing layer. Solar cells based on hybrid organic-inorganic halide perovskite halide materials, such as methylammonium tin halides, may be produced with simple solution processes in a traditional lab environment even at room temperature, while solar cells based on single crystals of silicon and other semiconducting compounds require expensive and multi processes, conducted at high temperatures in a high vacuum in special clean room facilities.

Power conversion efficiencies (PCE) of solar cells using these materials as light-absorbing layers have increased from 3.8% to 20.1% in current versions. With the potential of achieving even higher power conversion efficiencies and the very low production costs, hybrid organic-inorganic halide perovskite halide perovskite-based solar cells have become commercially attractive. Such hybrid organic-inorganic halide perovskite films also show strong light absorption, long-range balanced carrier transport length, and low non-radiative recombination rates. Moreover, hybrid organic-inorganic halide perovskite films have potential in light-emitting diodes, lasers and photodetectors.

Such hybrid organic-inorganic halide perovskite films have been fabricated by a variety of vapor assisted solution process, which include intramolecular exchange, solvent-engineering depositions, sequential deposition processes, enhanced "reconstruction" processes, and solution-based hot-casting techniques. Although the vapor assisted solution processes have routinely produced hybrid organic-inorganic halide perovskite films that show the power conversion efficiencies larger than 16%, the processes are expensive and impractical for a large-scale fabrication of hybrid organic-inorganic halide perovskite films.

More scalable techniques, such as spray-coating, inkjet printing, slot-die coating, doctor-blade coating, and hybrid chemical vapor deposition, have been developed. However, these techniques have failed to fabricate hybrid organic-inorganic halide perovskite films with comparable power conversion efficiencies larger than 15%.

SUMMARY OF INVENTION

In one aspect, one or more embodiments of the invention relate to a method of fabricating a hybrid organic-inorganic halide perovskite film that includes depositing a precursor layer onto a substrate, the precursor layer comprising metal halide, placing an organic source-material layer onto a boat, the organic source-material layer comprising an organic cation and annealing the precursor layer and the organic source-material layer in a vacuum chamber enclosed in a constrained volume.

In another aspect, one or more embodiments of the invention relate to a hybrid organic-inorganic halide perovskite solar cell device that includes a substrate, a hole blocking layer, a n-type semiconductor layer, the hybrid organic-inorganic halide perovskite film as a light-absorbing layer, a p-type semiconductor layer, and a metal grid.

In another aspect, one or more embodiments of the invention relate to a hybrid organic-inorganic halide perovskite photodetector that includes a substrate, a transparent conductive oxide (TCO) layer, a p-type semiconductor layer, the hybrid organic-inorganic halide perovskite film as a light absorbing layer, a n-type semiconductor layer, a hole blocking layer, and a metal contact.

In another aspect, one or more embodiments of the invention relate to a hybrid organic-inorganic halide perovskite thin film light emitting transistor that includes a gate, a gate oxide layer, the hybrid organic-inorganic halide perovskite film as a channel and light-emitting layer, a capping layer, a source, and a drain.

In another aspect, one or more embodiments of the invention relate to a hybrid organic-inorganic halide perovskite thin film light emitting device that includes a substrate, a p-type hole injecting layer, the hybrid organic-inorganic halide perovskite film as a light emitting layer, an n-type electron injecting layer, a hole-injecting material, and a metal contact.

Other aspects and advantages of the invention will be apparent from the following description and the appended claims.

BRIEF DESCRIPTION OF DRAWINGS

Embodiments of the invention will be described with reference to the accompanying drawings. However, the accompanying drawings illustrate only certain aspects or implementations of one or more embodiments of the invention by way of example and are not meant to limit the scope of the claims.

FIG. 1(a) is a schematic perspective view of a three-dimensional (3D) perovskite structure. FIG. 1(b) is a schematic perspective view of a two-dimensional (2D) layered perovskite.

DETAILED DESCRIPTION

Figure 2:
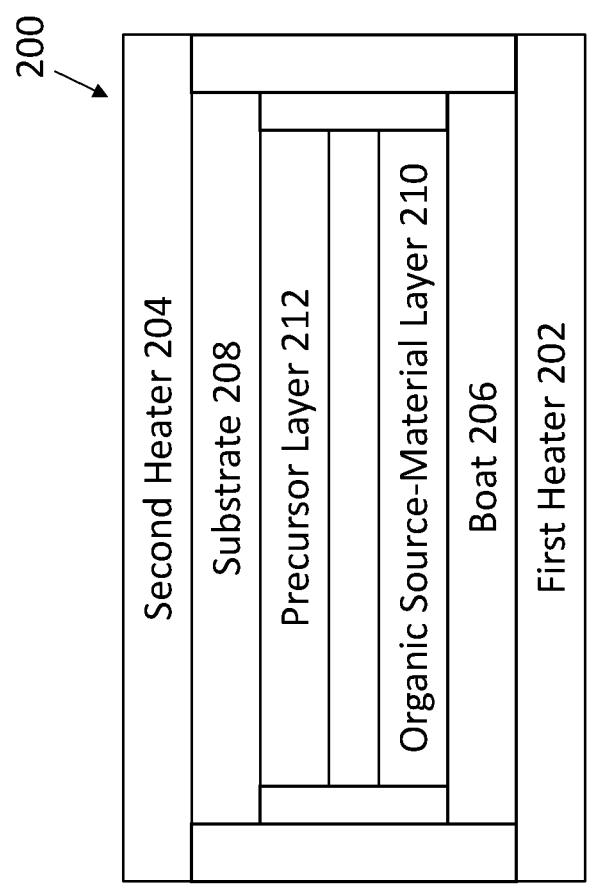
FIG. 2 illustrates an example closed-space sublimation (CSS) system in accordance with one or more embodiments.

Specific embodiments of the invention will now be described in detail with reference to the accompanying figures. Like elements in the various figures are denoted by like reference numerals for consistency. Further, the use of "FIG." in the drawings is equivalent to the use of the term "Figure" in the description.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the claimed invention relate to hybrid organic-inorganic halide perovskite films having a crystal structure, $AMX_3$, in which X is typically a halide anion such as $I^-$, $Br^-$, $Cl^-$ $F^-$, and any combination thereof, M is a divalent metal cation selected from $Cu_2^+$, $Ni_2^+$, $Co_2^+$, $Fe_2^+$, $Mn_2^+$, $Pd_2^+$, $Cd_2^+$, $Ge_2^+$, $Sn_2^+$, $Pb_2^+$, and $Eu_2^+$, and is preferably selected from $Sn_2^+$, $Pb_2^+$, and A is an organic cation, usually a small, and monovalent or divalent organic cation, such as methylammonium ($CH_3NH_3^+$), ethylammonium ($CH_3CH_2NH_3^+$), tetramethylammonium ($N(CH_3)_4^+$), formamidinium ($NH_2CHNH_2^+$), and guanidinium ($C(NH_2)_3^+$).

Overview of Perovskite Materials

Perovskite materials are compounds that have the same type of crystal structure as calcium titanium oxide ($CaTiO_3$), known as the perovskite structure, $AMX_3$, where A and M are two cations of very different sizes, and X is an anion that bonds to both. Traditional metal-oxide perovskites materials display a wide range of fascinating electromagnetic properties, including ferroelectricity and piezoelectricity, superconductivity and high magnetoresistance.

Hybrid organic-inorganic halide perovskite materials have attracted considerable attention due to their high power conversion efficiencies. In hybrid organic-inorganic halide perovskite e materials, X is a halide anion (Cl, Br or I), A is a small, monovalent or divalent organic cation such as methyl ammonium ($CH_3NH_3^+$), ethyl ammonium ($CH_3CH_2NH_3^+$), formamidinium ($NH_2CHNH_2^+$) and guanidinium ($C(NH_2)_3^+$), and M is a divalent metal cation ($Cu_2^+$, $Ni_2^+$, $Co_2^+$, $Fe_2^+$, $Mn_2^+$, $Pd_2^+$, $Cd_2^+$, $Ge_2^+$, $Sn_2^+$, $Pb_2^+$, $Eu_2^+$, etc.). Such hybrid organic-inorganic halide perovskite films may be formed in a three-dimensional (3D) structure, as shown in FIG. 1(a), ideally cubic perovskite structure, or a two-dimensional (2D) layered structure as shown in FIG. 1(b), depending on the sizes of the two cations A and M. Generally, when the organic cation A is small, for example, $CH_3NH_3^+$ or $NH_2CHNH_2^+$, the hybrid organic-inorganic halide perovskite material may be formed in a 3-D structure. Otherwise, a 2-D layered structure will be formed. Their crystallographic stability and probable structure may be estimated from a tolerance factor t and octahedral factor µ. Here the tolerance factor t is defined as $t=(R_A+R_X)/\{2^{1/2}(R_M+R_X)\}$, where $R_A$, $R_M$ and $R_X$ are the ionic radii of the cations A and M, and the anion X, respectively, and µ is defined as the ratio $R_M/R_X$. The tolerance fact t may be between 0.85 and 1.

While 2-D layered hybrid organic-inorganic halide perovskite films have been extensively studied mainly for applications in light emitting diodes and thin film transistors, 3-D hybrid organic-inorganic halide perovskite films have been studied for light-absorbing layers in solar cells. In 3-D hybrid organic-inorganic halide perovskite films for solar cells, the organic cation A is generally methyl ammonium ($CH_3NH_3^+$, $R_A$=0.18 nm) or formamidinium ($NH_2CHNH_2^+$, $R_A$=0.19-0.22 nm). The anion X is a halogen, generally I ($R_X$=0.22 nm), Br ($R_X$=0.196 nm), Cl ($R_X$=0.181 nm), or any combination thereof. The metal cation M has universally been Pb ($R_M$=0.119 nm) or Sn ($R_M$=0.110 nm).

Due to their strong tendency to crystallize, even at room temperature, hybrid organic-inorganic halide perovskite films may be conveniently deposited by a low temperature (at room temperature) solution process, using a solution of the source materials (i.e., the organic cation A and the metal halide $MX_2$). In a typical solution process, crystallization of perovskite materials occurs due to evaporation of the source materials. In other vapor assisted processes, a low temperature annealing or a solvent extraction approach may subsequently be employed to facilitate evaporation of the solution. Since the solution processes are simple and easily approachable, tremendous amount of studies achieved recently in the art is predominantly based on the solution processes. These include intramolecular exchange, solvent-engineering depositions, sequential deposition processes, enhanced "reconstruction" processes, and solution-based hot-casting techniques.

Perovskite materials in the form of $AMX_3$, according to one or more embodiment, have a 3-D structure as shown in FIG. 1(a), wherein A is at least one cation, M is at least one cation and X is at least one anion. Perovskite materials in the form of $A_2MX_4$, according to one or more embodiment, have a 2-D layered structure as shown in FIG. 1(b), wherein A is at least one cation, M is at least one cation and X is at least one anion.

Separated Layers in a Constrained Volume

In one more embodiments, a semiconducting hybrid organic-inorganic halide perovskite film may be fabricated by annealing the film in a constrained volume. FIG. 2 illustrates an example closed-space sublimation (CSS) system 200. The CSS system 200 includes a first heater 202, a second heater 204, a boat 206, a substrate 208, an organic source-material layer 210, and a precursor layer 212. The term "layer" is used interchangeably herein with "film."

Heaters

The first heater 202 may be suitable for heating the boat 206. The second heater 204 may be any suitable for heating the substrate 208. For example, in one embodiment each of the heaters 202, 204 may be a halogen lamp (500-1000 W) connected to a PID temperature controller with K-type thermocouple (Chromel & Alumel, 25-1350° C.). In alternative embodiments, heaters 202, 204 may be any suitable heating source. The heaters 202, 204 may provide heat via conduction, convection, radiation, or any combination thereof.

As used herein, the term "proportional-integral-derivative (PID) controller" refers to a control loop feedback controller commonly used in industrial control systems. A PID controller continuously calculates an error value as the difference between a desired setpoint and a measured process variable.

In one or more embodiments, the heaters 202 and 204 may be separated by 1-2 mm, and preferably 1.2 mm.

As used herein, the term "thermocouple" refers to an electrical device consisting of two different conductors forming electrical junctions at differing temperatures. A thermocouple produces a temperature-dependent voltage as a result of the thermoelectric effect, and this voltage can be interpreted to measure temperature. Type K is the most common general purpose thermocouple with a sensitivity of 28 to 42 µV/° C. It is inexpensive, and a wide variety of probes are available in its −200° C. to +1350° C. range.

Substrates

The boat 206 and the substrate 208 may be any suitable substrates capable withstanding high temperatures (between 100 and 200° C.), and pressures (1-500 Torr). The boat 206 and the substrate 208 may provide structural support for the organic source-material layer 210 and the precursor layer 212. For example, the boat 206 may be formed of aluminum, tungsten, graphite, stainless steel, another suitable substrate, or any combination thereof, and the substrate 208 may be formed of soda-line glass, flexible plastic substrates, stainless steel, another suitable substrate, or any combination thereof.

Precursor Layer and Source-Material Layer

The precursor layer 212 may be any suitable metal halide $MX_2$, in which X may be any suitable halide anion such as $I^-$, $Br^-$, $Cl^-$ $F^-$, and any combination thereof, and M may be any suitable a divalent metal cation such as $Cu_2^+$, $Ni_2^+$, $Co_2^+$, $Fe_2^+$, $Mn_2^+$, $Pd_2^+$, $Cd_2^+$, $Ge_2^+$, $Sn_2^+$, $Pb_2^+$, and $Eu_2^+$ described previously. The precursor layer 212 may be deposited on the substrate 208. Deposition of the metal halide $MX_2$ may be performed using any suitable thin film deposition process, such as, chemical-vapor deposition, evaporation, atomic-layer deposition, sputtering, particle coating, electro-deposition, another suitable deposition process, or any combination thereof. The precursor layer 212 may be any suitable thickness. In one or more embodiments, the coating layer of the substrate 208 may have a thickness of 30 nm to 500 nm.

The organic source-material layer 210 may be any suitable organic material, such as the small, monovalent or divalent organic cations, methyl ammonium ($CH_3NH_3^+$), ethyl ammonium ($CH_3CH_2NH_3^+$), formamidinium ($NH_2CHNH_2^+$) and guanidinium ($C(NH_2)_3^+$), described previously. The organic source-material layer 210 may be any suitable thickness.

In one more embodiments, the boat 206 may be of pressed-tablet shape and of size of 10 cm×10 cm. In one or more embodiments, the organic source-material layer 210 may be any suitable thickness. In one or more embodiments, the organic source-material layer 210 may have a thickness of 1 mm+0.1 mm.

The CSS system 200 may be capable of performing high-pressure, high-temperature processes. The deposition and annealing conditions in the CSS system 200 may be precisely controlled, monitored, and adjusted to optimize the deposition and annealing conditions yield high throughput, large area uniformity, flexibility in designing of fabricated materials. The CSS system 200 may be enclosed in a constrained volume, with minimal dead space in a mechanical-pumped vacuum chamber capable of base pressures of 0.001-0.01 Torr, operating temperatures 25-300° C., and processing times of 1 min-2 hours.

Although FIG. 2 illustrates a particular arrangement of the heaters 202, 204, the boat 206, substrate 208, the precursor layer 212, and the organic source-material layer 210, the scope of the invention should not be considered limited to these specific arrangements. For example, the CSS system 200 may include a flexible continuous web that carries the individual components into the vacuum chamber. Moreover, although FIG. 2 illustrates a particular number of heaters 202, 204, boats for the organic source material 206, substrates 208, precursor layers 212, and organic source-material layers 210, the scope of the invention should not be considered limited to these specific numbers. For example, the CSS system 200 may include multiple precursor layers 212 or organic source-material layers 210.

Insertion of Layers

In one more embodiments, the CSS system 200 may introduce the organic source-material layer 210 into proximity with the precursor layer 212. Any suitable mechanism may be used to introduce the organic source-material layer 210 into proximity with the precursor layer 212. For example, the precursor layer 212 and the organic source-material layer 210 may be manually inserted into the vacuum chamber of the CSS system 200 such that the precursor layer 212 and the organic source-material layer 210 are directly facing each other in the vacuum chamber. In one more embodiments, the precursor layer 212 and the organic source-material layer 210 may be separated from each other by a specified distance. The surface of the precursor layer 212 may be parallel to the organic source-material layer 210. For example, the precursor layer 212 and the organic source-material layer 210 may be separated from each other by 1-2 mm. As yet another example, the precursor layer 212 and the organic source-material layer 210 may be in contact with each other. In one more embodiments, the organic source-material layer 210 may be introduced over the precursor layer 212. For example, the precursor layer 212 may be manually inserted into the vacuum chamber of the CSS system 200 such that the precursor layer 212 is lying in a horizontal position. The organic source-material layer 210 may then be manually inserted into the vacuum chamber of the CSS system 200 such that the organic source-material layer 210 is also lying in a horizontal position opposite to the precursor layer 212. Although this disclosure describes introducing the organic source-material layer 210 over the precursor layer 212 in a particular manner, the scope of the invention should not be considered limited to this specific manner.

Pressure

In one more embodiments, the CSS system 200 may anneal the precursor layer 212 in the presence of the organic source-material layer 210. The annealing may be performed in the constrained volume under isochoric, isobaric, isothermal, or other suitable conditions. The annealing may be performed at any suitable pressure. For example, annealing may occur under vacuum, under partial vacuum, at atmospheric pressure, or with an overpressure of gas. In one or more embodiments, annealing may occur at 1-500 Torr. During annealing, the organic source material will sublimate at temperatures between 100 and 200° C., creating an atmosphere above the organic source-material layer 210 that has a high concentration of metal halide. As the organic source-material layer 210 decomposes into gaseous components, the constrained volume in the CSS system 200 may create an overpressure of organic halide. In one more embodiments, the decomposition reaction of the organic source material may be further controlled by adding $N_2$, $O_2$, air, $H_2$, or any combination thereof to the CSS system 200 to control the partial pressure of each gas. By maintaining relatively high partial pressures of these gases, the decomposition of the precursor layer 212 at temperatures between 100 and 200° C., may be reduced or suppressed by shifting the equilibrium of the decomposition reaction of the organic source material, such that it is slowed or even reversed. Thus, the precursor layer 212 may be annealed at temperatures between 100 and 200° C., without any decomposition. In one or more embodiments, the organic source material may intercalate the precursor layer 212 and reconstruct the crystal structure in the precursor layer 212. The resulting structure largely depends on the size of the organic cations in the organic source material. Small organic cations may result in 3-D perovskite structure, while large organic cations may result in 2-D layered perovskite structure.

In one more embodiments, other gaseous components may be added to the CSS system 200 during annealing. For example, the atmosphere during annealing may comprise Dimethylformamide (DMF), Dimethyl sulfoxide (DMSO), gamma-Butyrolactone (GBL), Methylamine ($CH_3NH_2$), Hydrogen iodide (HI), another suitable gas, or any combination thereof. In one more embodiments, the total pressure of the gas atmosphere in the CSS system 200 may range from, for example, 1 to 500 Torr.

Temperatures

In one or more embodiments, the first heater 202 and the second heater 204 may heat the boat 206 and the substrate 208 to a first temperature (between 100 to 200° C.) and a second temperature (between 100 to 200° C.), respectively, during annealing. The boat 206 and the substrate 208 may then be held at the first temperature and at the second temperature, respectively, for 2-10 minutes. The boat 206 and the substrate 208 may then be cooled to a third temperature of 25° C.-50° C.

Although this disclosure describes annealing the precursor layer 212 in a particular manner, the scope of the invention should not be considered limited to this specific manner.

Methods

Figure 3:
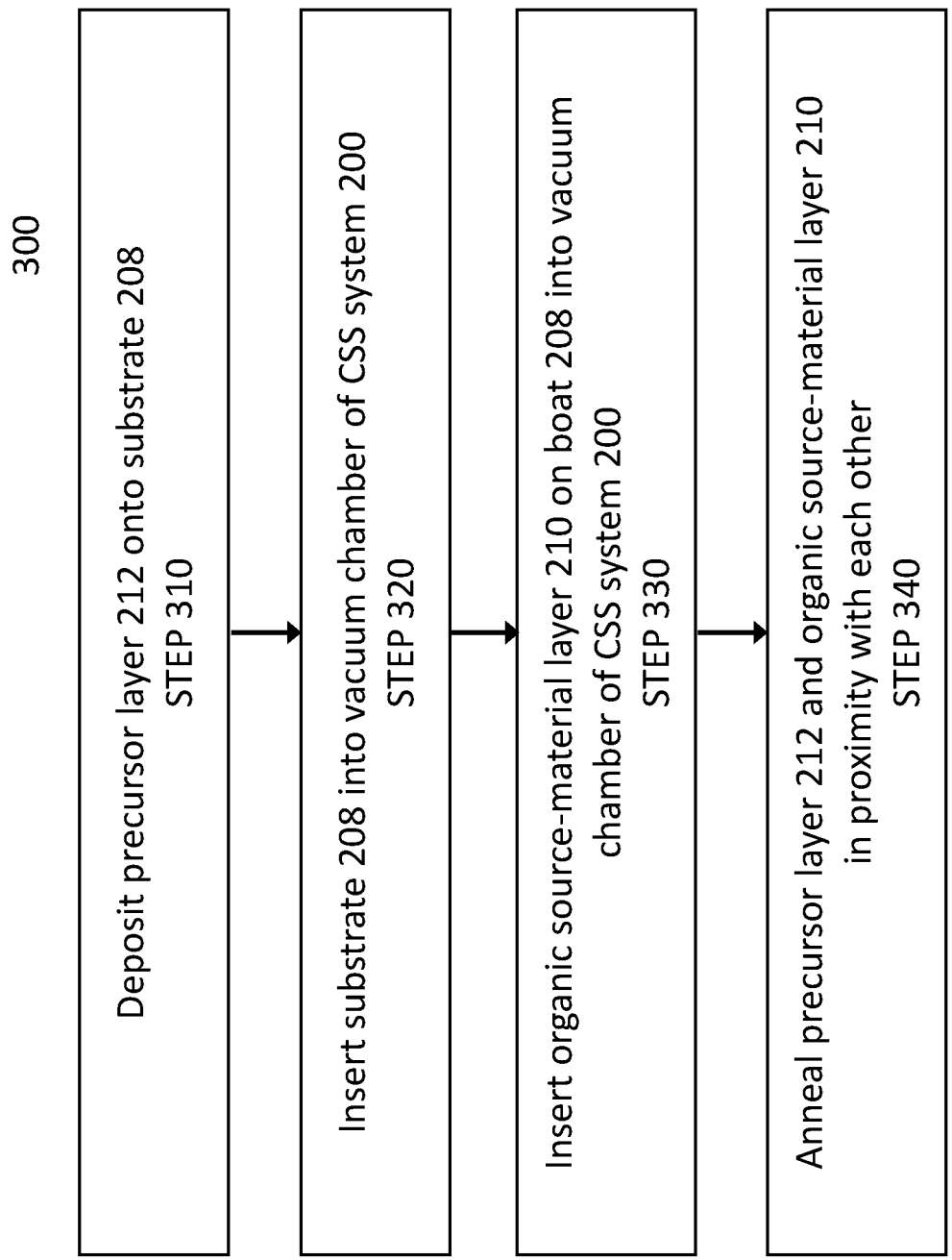
FIG. 3 illustrates an example method for fabricating a hybrid organic-inorganic halide perovskite thin film in accordance with one or more embodiments.

FIG. 3 illustrates an example method 300 for fabricating a hybrid organic-inorganic halide perovskite thin film by annealing the precursor layer 212 and the organic source-material layer 210 in the constrained volume.

At STEP 310, the precursor layer 212 is deposited onto the substrate 208. The precursor layer 212 may comprise any suitable metal halide $MX_2$, in which X may be any suitable halide anion such as $I^-$, $Br^-$, $Cl^-$ $F^-$, and the any combination thereof, M may be any suitable a divalent metal cation such as $Cu_2^+$, $Ni_2^+$, $Co_2^+$, $Fe_2^+$, $Mn_2^+$, $Pd_2^+$, $Cd_2^+$, $Ge_2^+$, $Sn_2^+$, $Pb_2^+$, and $Eu_{2+}$ described previously.

At STEP 320, the substrate 208, on which the precursor layer 212 is deposited, may be inserted into the vacuum chamber of the CSS system 200.

At STEP 330, the organic source-material layer 210 on the boat 206 may be introduced opposite to the precursor layer 212. The organic source-material layer 210 on the boat 206 may comprise any suitable organic material, such as the small, monovalent or divalent organic cations, methyl ammonium ($CH_3NH_3^+$), ethyl ammonium ($CH_3CH_2NH_3^+$), formamidinium ($NH_2CHNH_2^+$) and guanidinium ($C(NH_2)_3^+$), described previously.

At STEP 340, the CSS system 200 may anneal the precursor layer 212 and the organic source-material layer 210 in proximity with each other. Annealing may be performed in the constrained volume.

Particular embodiments may repeat one or more steps of the method of FIG. 3, where appropriate. Although this disclosure describes and illustrates particular steps of the method of FIG. 3 as occurring in a particular order, the scope of the invention should not be considered limited to this particular order. For example, method 300 may be repeated multiple times with repeated deposition of precursor layers to provide a multi-layered variable or graded band gap absorber. Moreover, although this disclosure describes and illustrates particular components, devices, or systems carrying out particular steps of the method of FIG. 3, the scope of the invention should not be considered limited to these particular components, devices, or systems.

Observed Properties

Figure 4B:
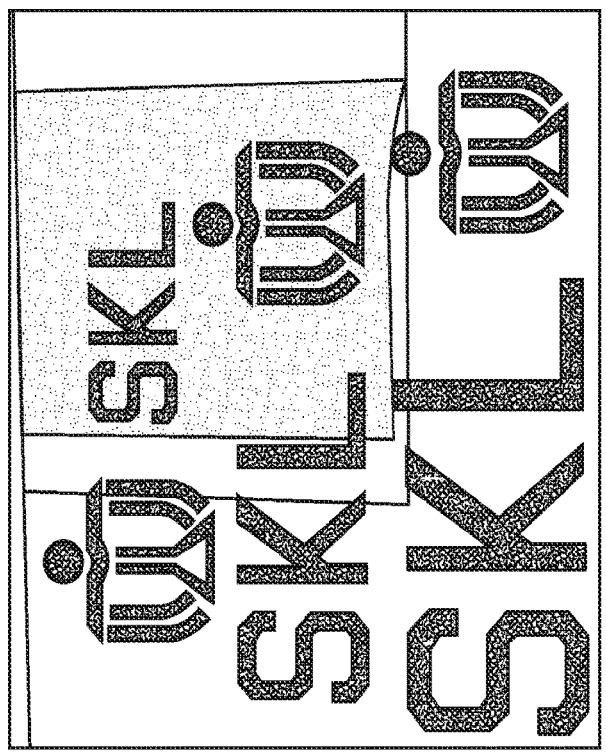
FIG. 4(b) illustrates a photograph of an example hybrid organic-inorganic halide perovskite layer after annealing in the CSS system in accordance with one or more embodiments.
Figure 4A:
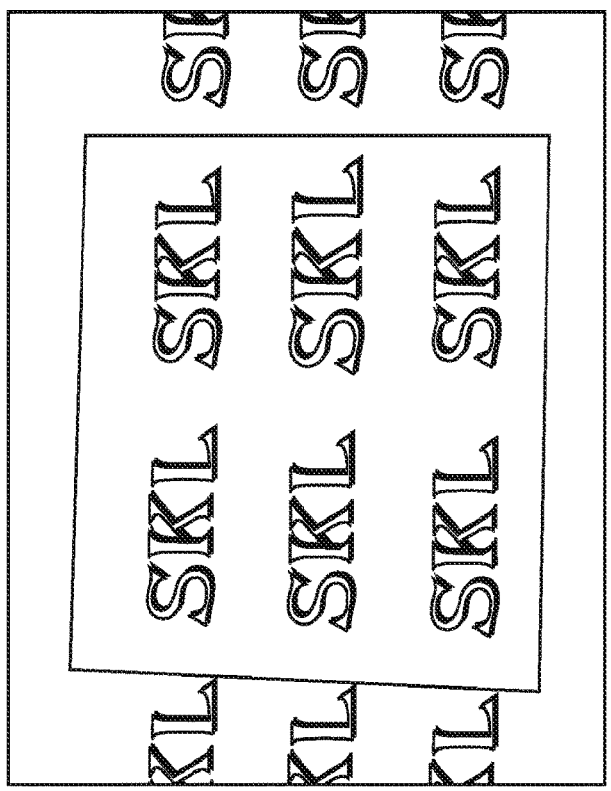
FIG. 4(a) illustrates a photograph of an example precursor layer before annealing in the CSS system in accordance with one or more embodiments.

FIG. 4(a) illustrates a photograph of an example precursor layer 212 on a substrate 208 (transparent) before annealing in the CSS system 200. FIG. 4(b) illustrates a photograph of the precursor layer 212 after annealing in the CSS system 200. The Layer 212 takes on red brown hue, a hybrid organic-inorganic halide perovskite is formed. In this example, the precursor layer 212 comprises lead chloride, $PbCl_2$, and was deposited onto the substrate 208 by evaporation. The substrate 208, on which the precursor layer 212 is deposited, was then inserted into the vacuum chamber of the CSS system 200. The organic source-material layer 210 comprises methylammonium ($CH_3NH_3^+$), and was placed onto a boat 206. The boat 206, on which the organic source-material layer 210 is placed, was inserted into the vacuum chamber of the CSS system 200 opposite to the precursor layer 212. During annealing, the first heater 202 for heating the boat 206 was set 100-170° C. and the second heater 204 for heating the substrate 208 was set 100-160° C., for a time duration of 2-10 min. The hybrid organic-inorganic halide perovskite layer fabricated in this example comprises $CH_3NH_3PbI_{3-x}Cl_x$.

Figure 5:
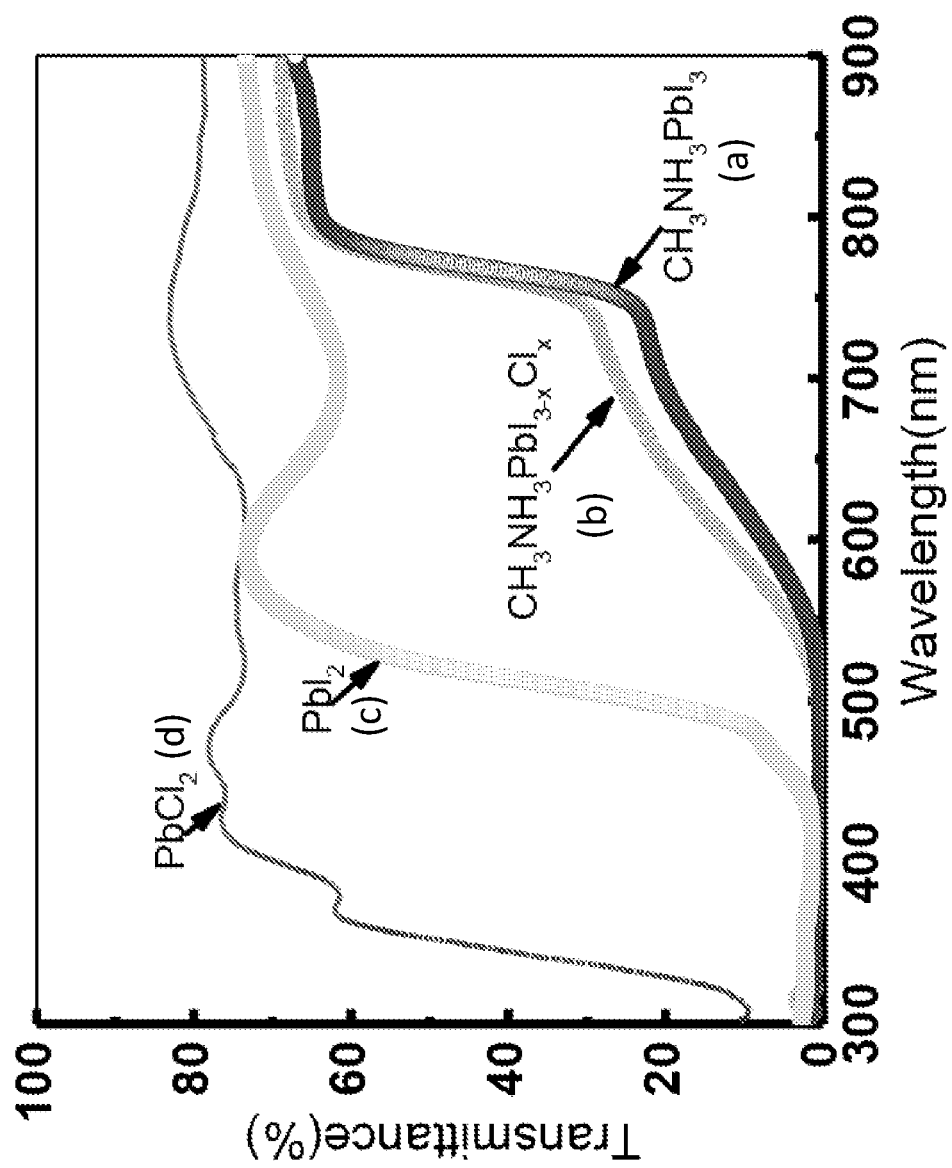
FIG. 5 illustrates transmittance spectra of hybrid organic-inorganic perovskites layers and precursor layers in accordance with one or more embodiments.

FIG. 5 illustrates transmittance spectra of hybrid organic-inorganic perovskites layers, $CH_3NH_3PbI_3$ (a) and $CH_3NH_3PbI_{3-x}Cl_x$ (b), respectively, and their originating precursor layers, $PbI_2$ (c) and $PbCl_2$ (d). The organic source materials are methylammonium ($CH_3NH_3^+$). Both of the hybrid organic-inorganic halide perovskite layers (a), (b) show similar transmittance spectra, while they differ at a wavelength 550 nm to 750 nm. At a wavelength around 800 nm and below, the transmission is significantly low, leading to a high absorption efficiency of about 80%. The wavelength about 800 nm corresponds to a bandgap energy 1.55 eV of the hybrid organic-inorganic halide perovskite layers, $CH_3NH_3PbI_{3-x}Cl_x$ and $CH_3NH_3PbI_3$, which is in good agreement with data reported for such thin films fabricated solely by a vapor assisted solution process. Furthermore, both of the films in these examples are uniform over a size of 5 cm×5 cm. However, it should be noted that the size is limited by an example CSS system 200. In other words, hybrid organic-inorganic halide perovskite films of a larger-scale uniformity may be fabricated when the CSS system 200 is scaled up in size.

Figure 6:
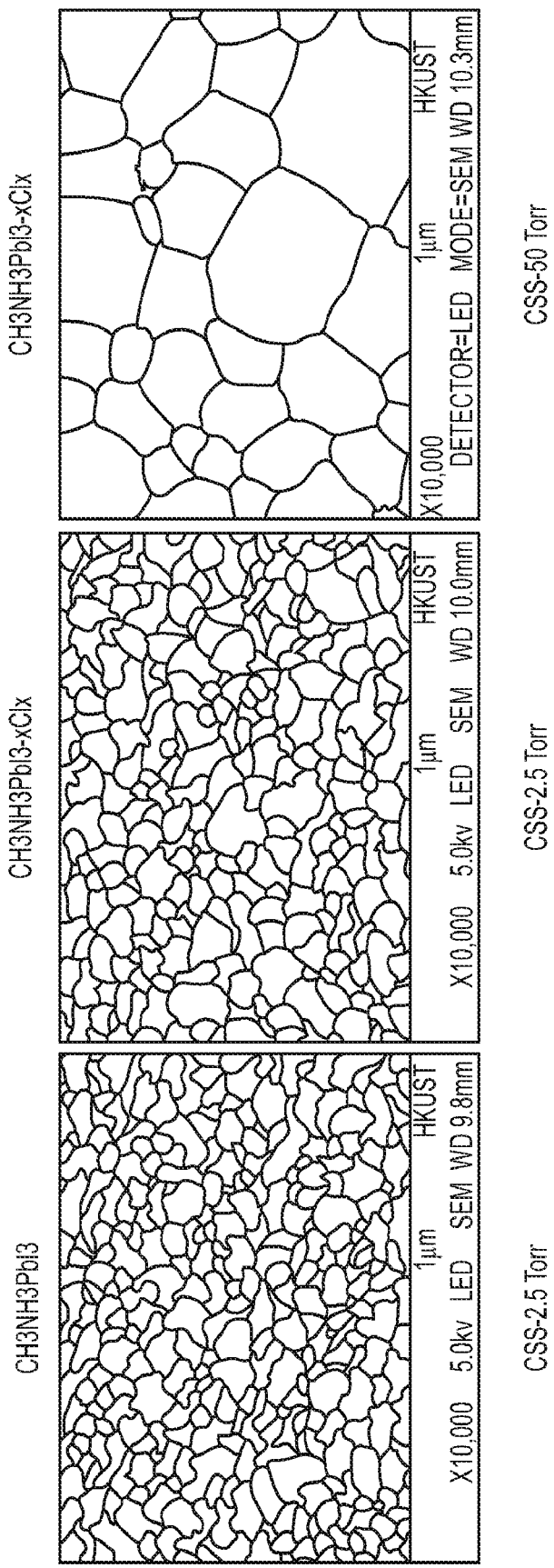
FIGS. 6(a)-6(c) illustrate scanning electron microscopy (SEM) images of hybrid organic-inorganic halide perovskite layers in accordance with one or more embodiments.

FIGS. 6(a)-6(c) illustrate scanning electron microscopy (SEM) images of the hybrid organic-inorganic halide perovskite layers, $CH_3NH_3PbI_{3-x}Cl_x$ and $CH_3NH_3PbI_3$, described above. FIGS. 6(a) and 6(b) show that $CH_3NH_3PbI_3$ film and $CH_3NH_3PbI_{3-x}Cl_x$ film, fabricated at a pressure 2.5 Torr, have large grains of micrometers, which are densely interconnected with minimal defects, while thin films fabricated solely by a vapor assisted solution process typically have smaller grains of hundreds of nanometers with porous morphology. FIG. 6(c) shows that $CH_3NH_3PbI_{3-x}Cl_x$ film, fabricated at an increased pressure 50 Torr, has larger grains of 1-4 μm.

As a hybrid organic-inorganic halide perovskite film, used as a light-absorbing layer in a solar cell, has typically thickness of 350 nm±30 nm, larger grain sizes may contribute to reduce recombination and scattering of charge carriers at grain boundaries, and produce high performance solar cells. Such defect-free films with larger grain sizes may be partly attributed to the process without solvation or dewetting processing.

Further, $CH_3NH_3PbI_3$ film shown in FIG. 6(a) and $CH_3NH_3PbI_{3-x}Cl_x$ film shown in FIG. 6(b), fabricated in the CSS system 200 in accordance with one or more embodiments, show no apparent difference in surface morphologies. This may suggest that Cl ions do not play a critical role in crystal growth and surface morphology in a vapor assisted solution process, possibly because Cl ions are released from the precursor layer 212 during annealing at a temperature of 150° C.

Figure 7:
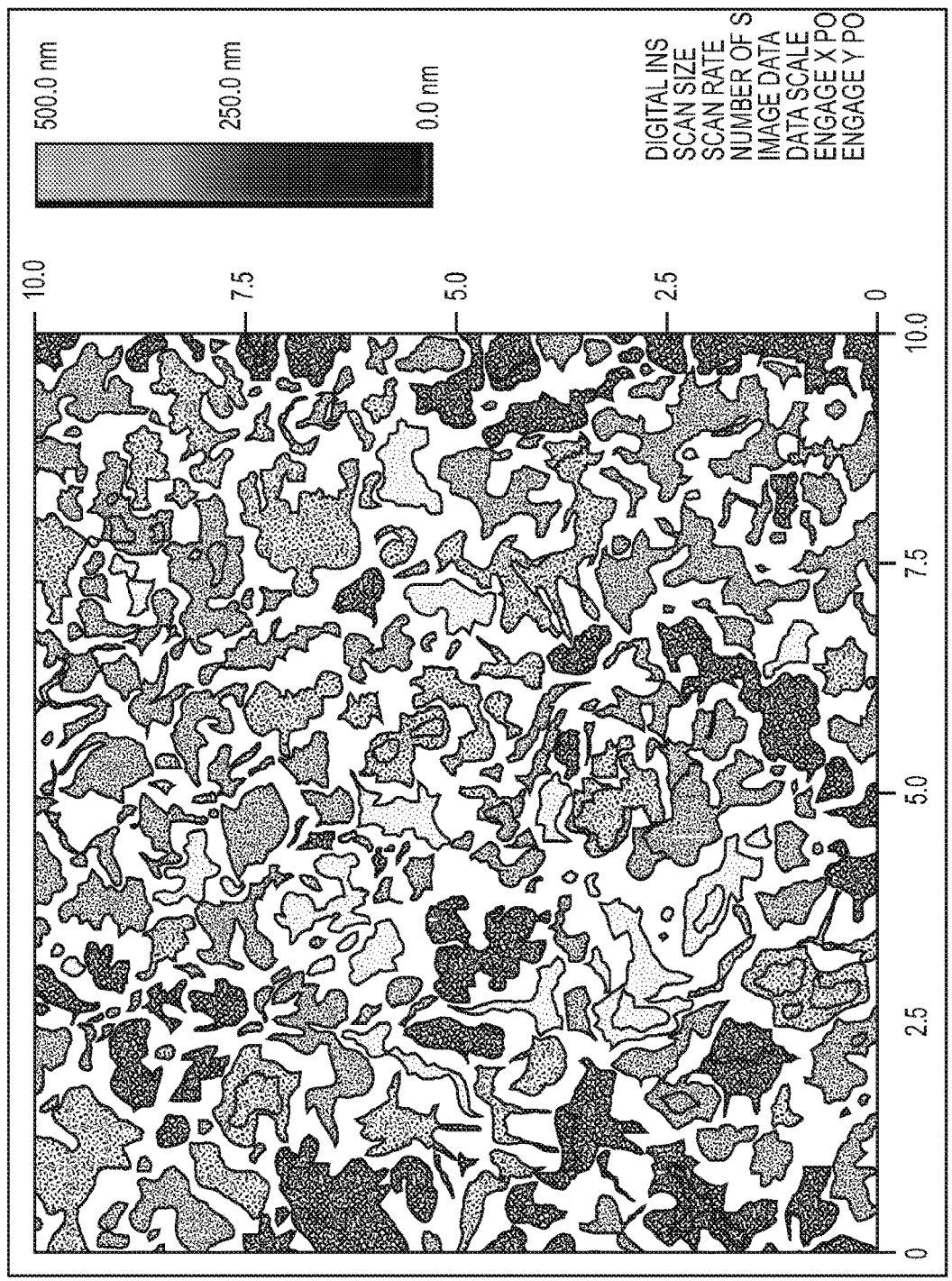
FIG. 7 illustrates an atomic force microscope (AFM) image of $CH_3NH_3PbI_{3-x}Cl_x$ film in accordance with one or more embodiments.

FIG. 7 illustrates an atomic force microscope (AFM) image of $CH_3NH_3PbI_{3-x}Cl_x$ film shown in FIG. 6(a) and shows a relatively low roughness with the root-mean-square roughness of 29 nm.

As used herein, the term "root-mean-square roughness" refers to the square root of the sum of the squares of the individual heights and depths from the mean height of a surface.

Figure 8:
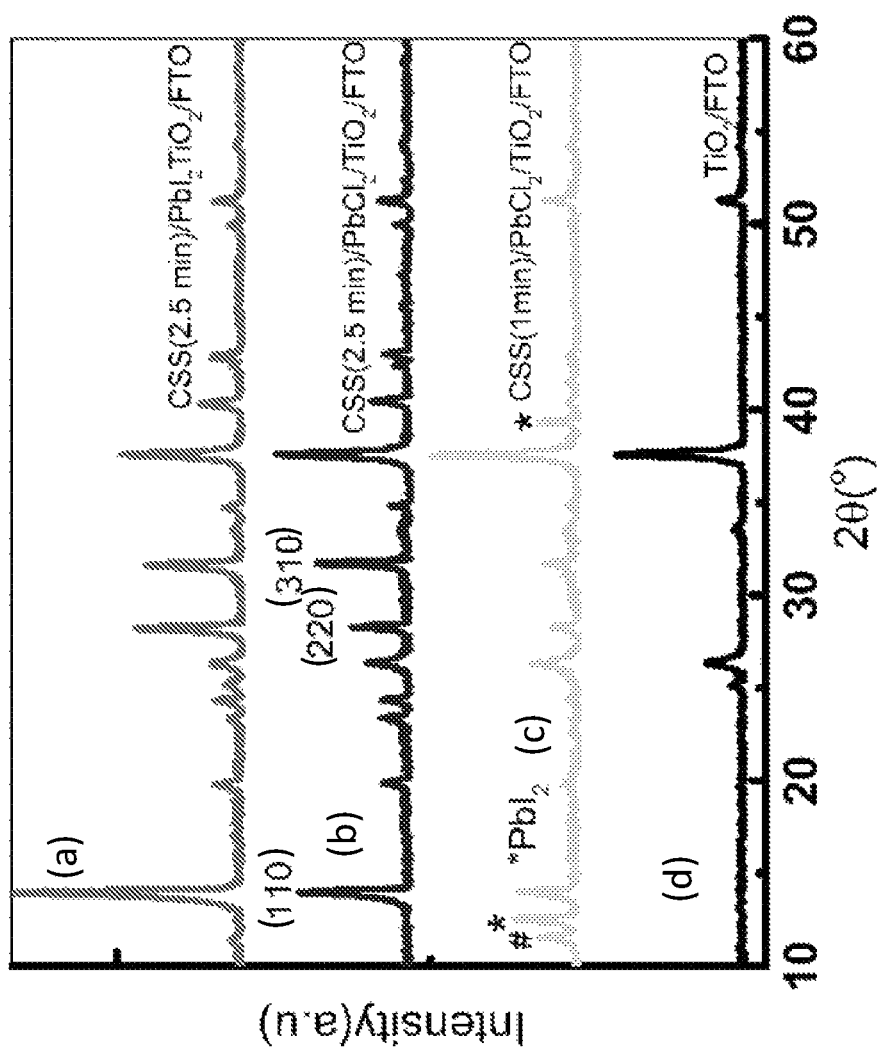
FIG. 8 illustrates an X-Ray diffraction pattern of hybrid organic-inorganic halide perovskite films in accordance with one or more embodiments.

FIG. 8 illustrates an X-Ray diffraction pattern of hybrid organic-inorganic halide perovskite films in accordance with one or more embodiments. The precursor layer may comprise $PbI_2$ in one film (a), $PbCl_2$ in the other films (b), (c), and a substrate $TiO_2$ (d). The diffraction patterns show the primary peaks and may be used for identifying the crystal structures of the hybrid organic-inorganic halide perovskite layers, in which the crystalline atoms cause a beam of incident X-ray to diffract into many specific directions. These diffracted beams at angles 13.95°, 28.26°, and 31.72° correspond to beams diffracted at (110), (220), and (310) planes for the films (a), (b), and (c).

As used herein, the notation "(hkl)" (h, k, and l are integers) refers to Miller indices form a notation system in crystallography for planes in crystal (Bravais) lattices.

In the films (a) and (b), fabricated in the CSS system 200 in accordance with one or more embodiments, the primary peak for (310) has larger intensity than the peaks for (110) and (220), whereas in the film (c), fabricated by a variety of vapor assisted solution process with $PbCl_2$, no significant primary peak for (310) was observed. The difference in the crystal structures between the films (a), (b) and the film (c) may be attributed growth competition between different crystalline phase orientations, since there are no excess organic source materials at the beginning of annealing to react with the metal halide to form a crystal structure in a preferred orientation in accordance with one or more embodiments. This is in contrast with a variety of vapor assisted solution process, in which there are excess organic source materials at the beginning of annealing to form a crystal structure in a preferred orientation. Further it should be noted that, in such crystallization, Cl in the $CH_3NH_3PbI_{3-x}Cl_x$ film may full be crystallized into $CH_3NH_3PbI_{3-x}Cl_x$ film, without leaving a crystalline phase related to Cl, which is in good agreement with data reported for such thin films fabricated solely by a vapor assisted solution process.

Figure 9:
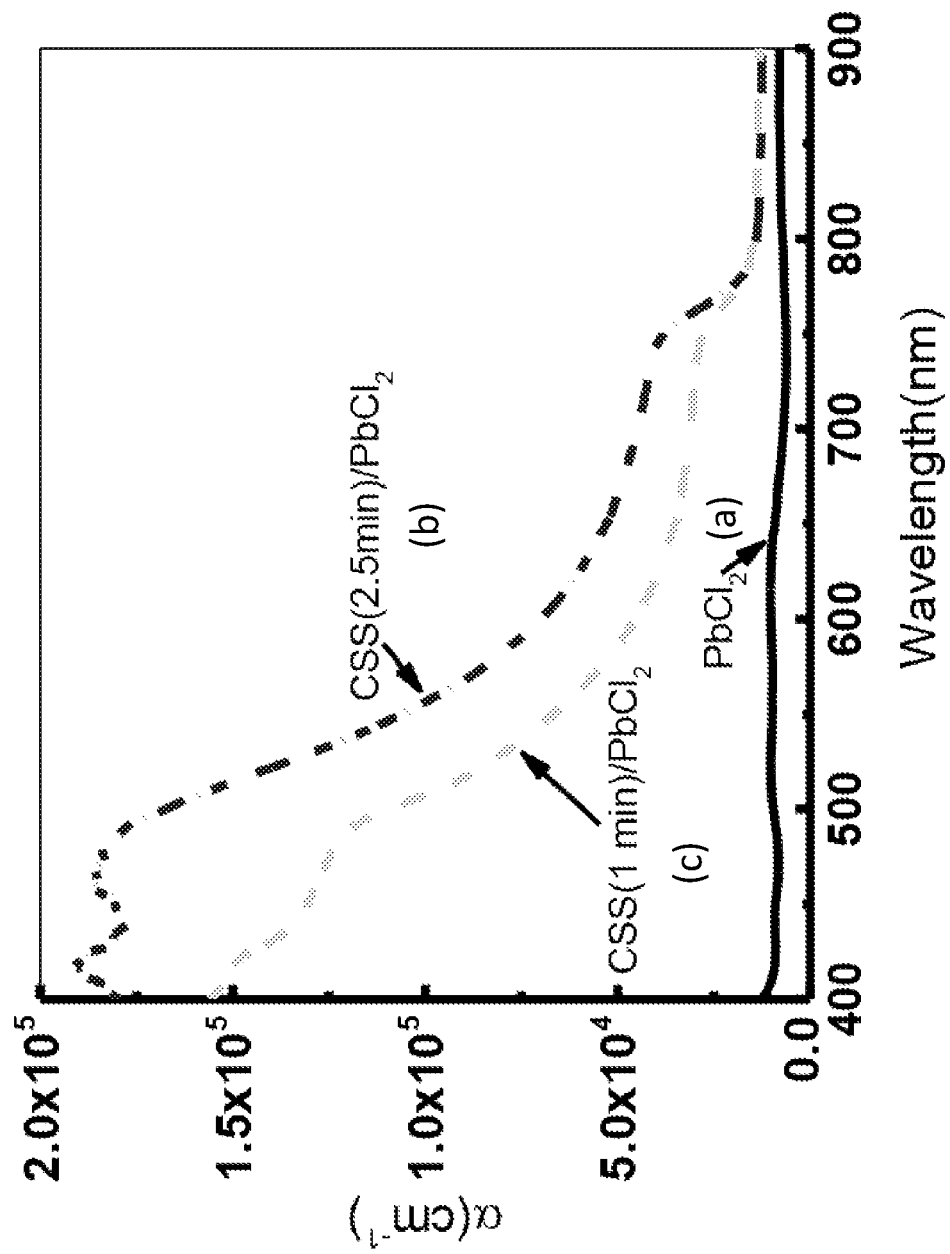
FIG. 9 illustrates an absorption coefficient of a precursor film and hybrid organic-inorganic halide perovskite films in accordance with one or more embodiments.

FIG. 9 illustrates an absorption coefficient of a $PbCl_2$ precursor film (a) and hybrid organic-inorganic halide perovskite $CH_3NH_3PbI_{3-x}Cl_x$ films (b), (c) calculated from observed transmittance spectra in an ultraviolet to visible wavelength range. The $PbCl_2$ precursor film (a) deposited on a substrate is transparent (i.e., no absorption). As excepted, the absorption coefficient of the hybrid organic-inorganic halide perovskite films increases as annealing in the CSS system 200 in accordance with one or more embodiments progresses. FIG. 9 shows that the film annealed for 2.5 minutes (b) has a larger absorption coefficient than the film annealed for 1 minute (c).

FIG. 9 further shows an onset in the absorption coefficient at a wavelength about 800 nm, which corresponds to a bandgap energy 1.55 eV of the hybrid organic-inorganic halide perovskite $CH_3NH_3PbI_{3-x}Cl_x$ films. The two additional peaks in the absorption coefficient at wavelengths 760 nm and 480 nm may be attributed to gapless electronic transitions between $VB_1$ (first valence band maximum) and $CB_1$ (conduction band minimum) and ones between the ones of $VB_2$ (second valence band maximum) and $CB_1$, respectively, which is in good agreement with data reported for such thin films fabricated solely by a vapor assisted solution process. As those electronic transitions involve no energy gap, there are no significant effects in the absorption coefficient.

Figure 10:
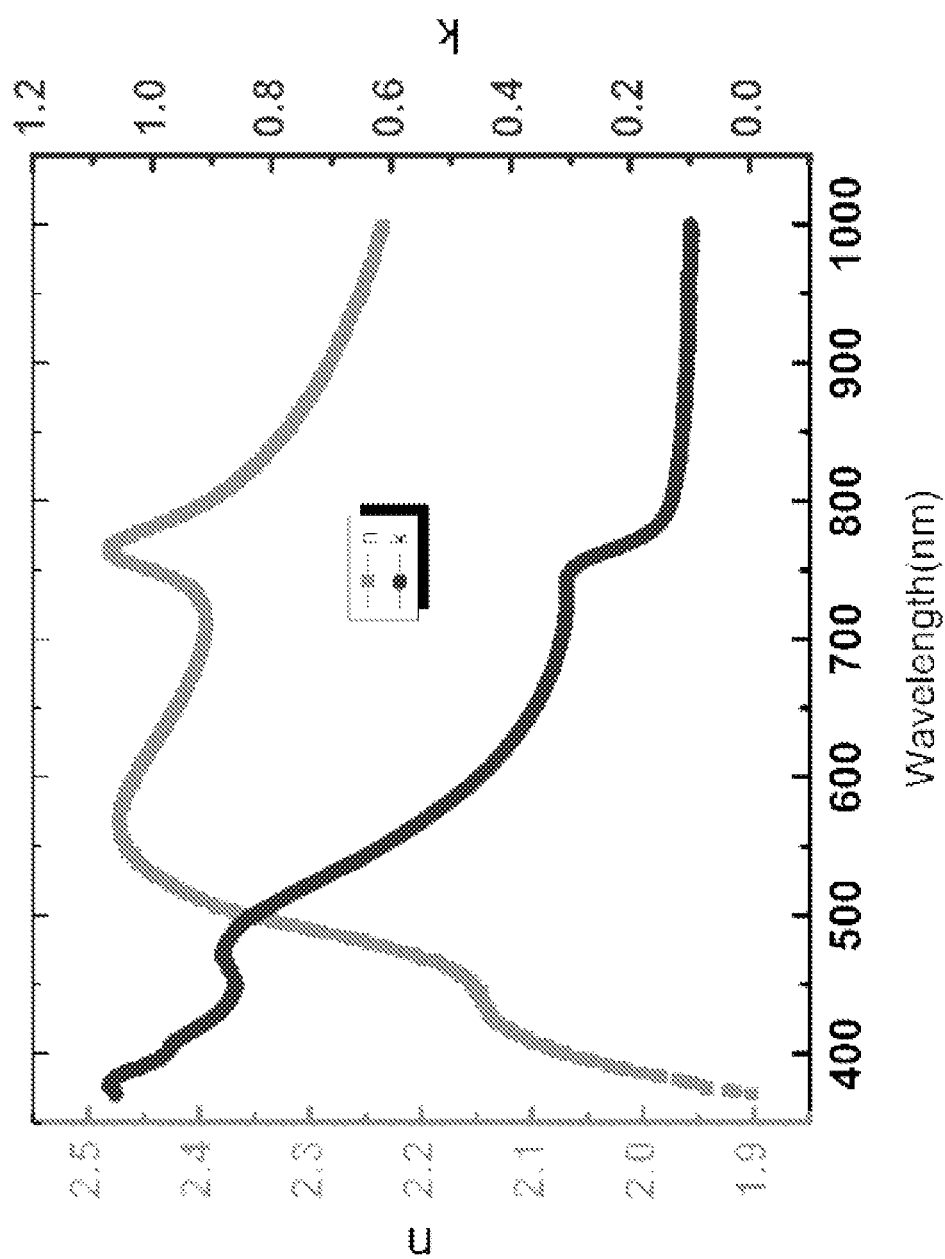
FIG. 10 illustrates a complex refractive index of a hybrid organic-inorganic halide perovskite film in accordance with one or more embodiments.

FIG. 10 illustrates a complex refractive index of a hybrid organic-inorganic halide perovskite film in accordance with one or more embodiments, obtained by variable-angle spectroscopic ellipsometry (VASE).

As used herein, the term "complex refractive index" refers to a property of a medium that quantifies the attenuation and the decrease in the local phase velocity of light propagating in the medium compared to its phase velocity in vacuum. Specifically, the real part n is the refractive index and indicates the phase velocity, while the imaginary part κ is the extinction coefficient and indicates the amount of attenuation of the light.

As used herein, the term "ellipsometry" refers to an optical technique for investigating dielectric properties (complex refractive index or dielectric function) of thin films. Ellipsometry measures the change of polarization upon reflection or transmission and compares it to a model.

The extinction coefficient κ exhibits three distinct peaks at wavelengths 760 nm, 480 nm, and 390 nm. The first two peaks at wavelengths 760 nm, 480 nm are consistent with the peaks in the absorption coefficient at wavelengths 760 nm and 480 nm shown in FIG. 9, and also in good agreement with data reported for such thin films fabricated solely by a vapor assisted solution process. The real part of the complex refractive index n is measured between 1.9 to 2.5 in the range of wavelength between 400 and 900 nm.

In this range of wavelength, the refractive indices of blocking layers, fluorine-doped tin oxide (FTO) and $TiO_2$ are between 1.7 and 2, and between 2 and 2.4. As used herein, the term "blocking layer" refers to an anti-reflection layer that blocks reflection of incoming light and increases light absorption. As a result, even without any widely-used light trapping schemes in solar cells, such as texture surface and antireflective coating, the light reflection may be reduced and the light path length may be increased, leading to a high absorption. Such blocking layers with the anti-reflection effect may provide an ideal top cell in a monolithic solar cell made of a perovskite layer and silicon.

Device Stacks

Figure 11:
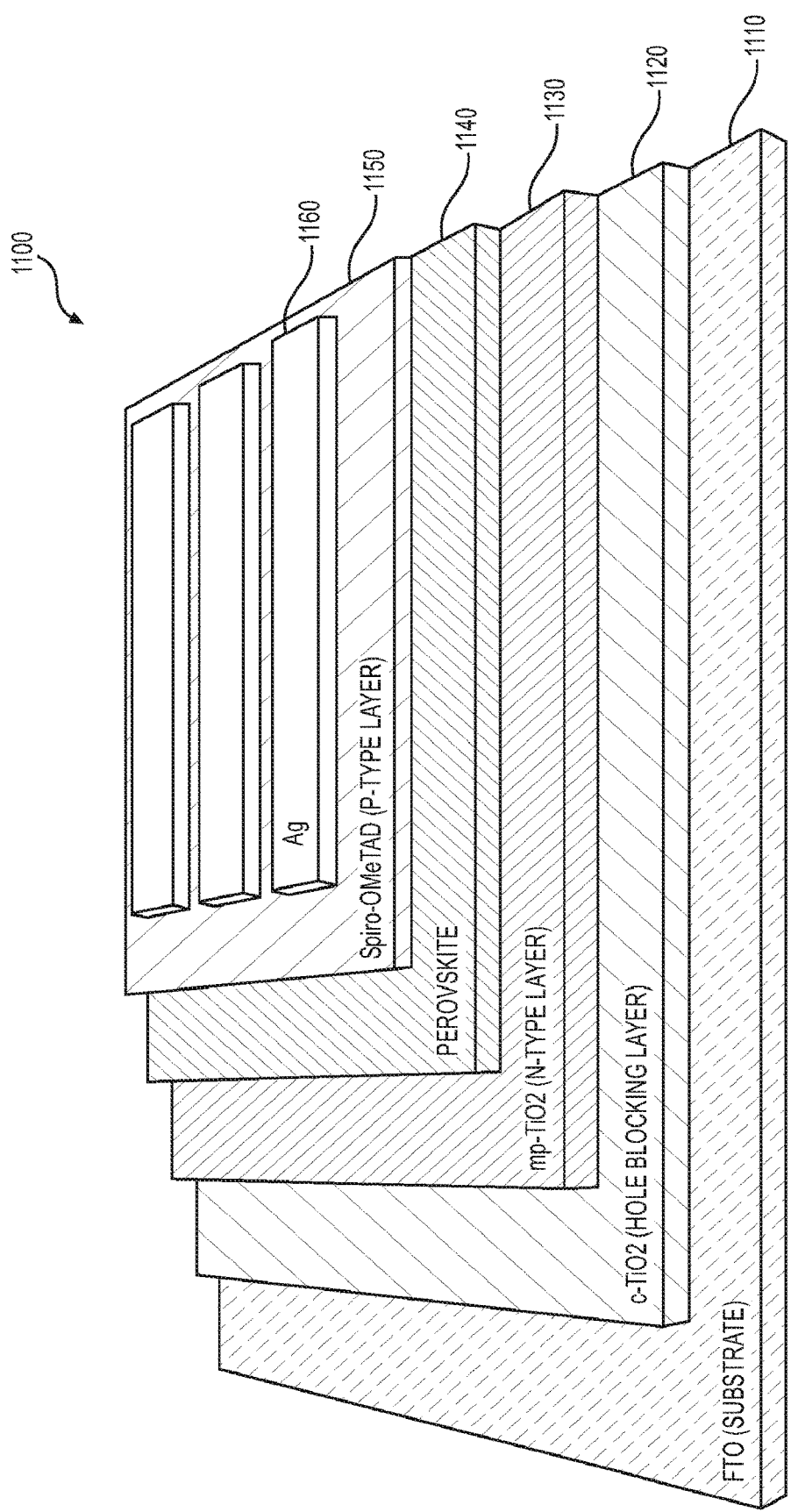
FIG. 11 illustrates an example hybrid organic-inorganic halide perovskite solar cell device stack in accordance with one or more embodiments.

FIG. 11 illustrates an example hybrid organic-inorganic halide perovskite solar cell device stack 1100. A hybrid organic-inorganic halide perovskite film layer fabricated by the methods described previously may be incorporated into the example device structure illustrated in FIG. 11. The device stack 1100 includes a substrate 1110, a hole blocking layer 1120, a n-type semiconductor layer 1130, a light-absorbing layer 1140, a p-type semiconductor layer 1150, and a metal grid 1160.

In one or more embodiments, the substrate 1110 may be fluorine-doped tin oxide (FTO) coated glass and may have thickness of 0.7-3 mm. The hole blocking layer 1120, deposited onto the substrate 1110 by sputtering, may be $TiO_2$ and may have thickness of 10-50 nm. The n-type semiconductor layer 1130 may be n-type $TiO_2$ and may have thickness of 20-100 nm. The precursor layer may be $PbCl_2$ and deposited onto the n-type semiconductor layer 1130. The light-absorbing layer 1140 may be a $CH_3NH_3PbI_{3-x}Cl_x$ thin film as described herein and may have thickness of 50-500 nm.

In one or more embodiments, the device stack may be a planar-structured device. The $PbCl_2$ precursor layer may be evaporated onto the n-type $TiO_2$ layer 1130, and the light-absorbing layer 1140 may be fabricated by the methods described previously.

In one or more embodiments, the device stack 1100 may be a nanostructured device. The $PbCl_2$ precursor layer may be infiltrated into the mesoprous n-type TiO2 layer 1130. As used herein, the term "mesoprous" refers to having pores with diameters between 2 and 50 nm.

In one or more embodiment, the p-type semiconductor layer 1150 may be a p-type hole conductor, 2,2',7,7'-tetrakis-(N,N-di-p-methoxyphenylamine)-9,9-spirobifluorene (spiro-MeOTAD) and may have thickness of 20-100 nm. The metal grid 1160 may be Ag and may have thickness of 50-200 nm.

Although FIG. 11 illustrates a particular arrangement of a substrate 1110, a hole blocking layer 1120, a n-type semiconductor layer 1130, a light-absorbing layer 1140, a p-type semiconductor layer 1150, and a metal grid 1160, the scope of the invention should not be considered limited to the particular arrangement. For example, the position of the p-type semiconductor layer 1150 and the light-absorbing layer 1140 may be switched, such that the p-type semiconductor layer 1150 may be deposited on the substrate 1110 and the light-absorbing layer 1140 may be deposited on the p-type semiconductor layer 1150. Moreover, although FIG. 11 illustrates a particular number of hole blocking layers 1120, n-type semiconductor layers 1130, light-absorbing layers 1140, p-type semiconductor layers 1150, and metal grids 1160, the scope of the invention should not be considered limited to this particular number.

Figure 12:
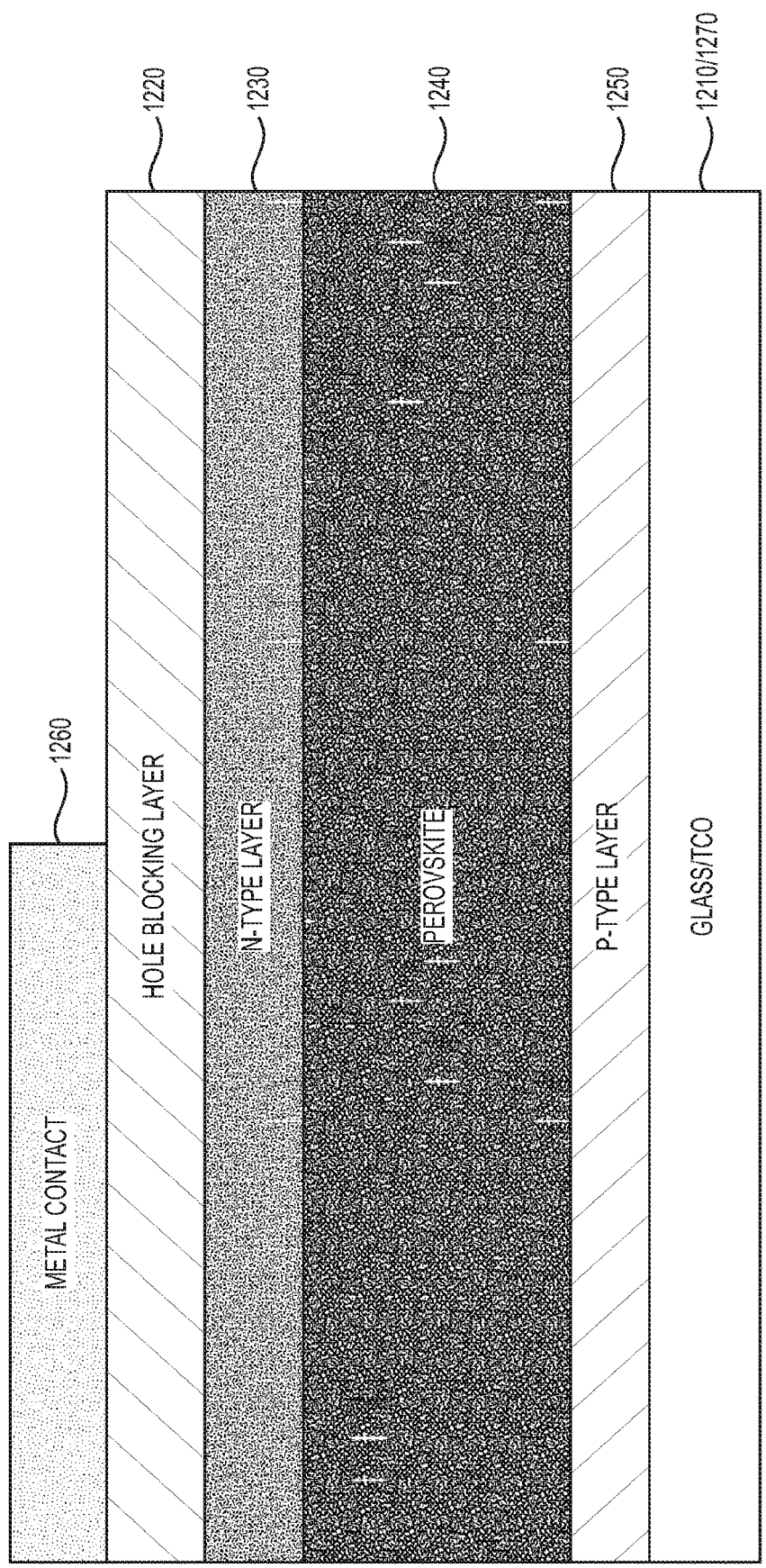
FIG. 12 illustrates an example hybrid organic-inorganic halide perovskite photodetector in accordance with one or more embodiments.

FIG. 12 illustrates an example hybrid organic-inorganic halide perovskite photodetector 1200. A hybrid organic-inorganic halide perovskite film layer fabricated by the methods described previously may be incorporated into the example device structure illustrated in FIG. 12. The photodetector 1200 includes a substrate 1210, a transparent conductive oxide (TCO) layer 1270, a p-type semiconductor layer 1250, a light absorbing layer 1240, a n-type semiconductor layer 1230, a hole blocking layer 1220 and a metal contact 1260.

In one or more embodiments, the substrate 1210 may be fluorine-doped tin oxide (FTO) coated glass and may have thickness of 0.7-3 mm. The transparent conductive oxide (TCO) layer 1270 may be Indium tin oxide (ITO) and may have thickness of 50-800 nm. The p-type semiconductor layer 1250 may be a p-type hole conductor, 2,2',7,7'-tetrakis-(N,N-di-p-methoxyphenylamine)-9,9-spirobifluorene (spiro-MeOTAD) and may have thickness of 20-100 nm. The light-absorbing layer 1240 may be a hybrid organic-inorganic halide perovskite film, such as $CH_3NH_3PbI_{3-x}Cl_x$ thin film as described herein and may have thickness of 50-1000 nm. The n-type semiconductor layer 1230 may be n-type $TiO_2$ and may have thickness of 20-100 nm. The hole blocking layer 1220, deposited onto the substrate 1210 by sputtering, may be $TiO_2$ and may have thickness of $TiO_2$ and may have thickness of 10-50 nm. The metal grid 1260 may be Al, Au, or any suitable metal and may have thickness of 50-200 nm.

Figure 13:
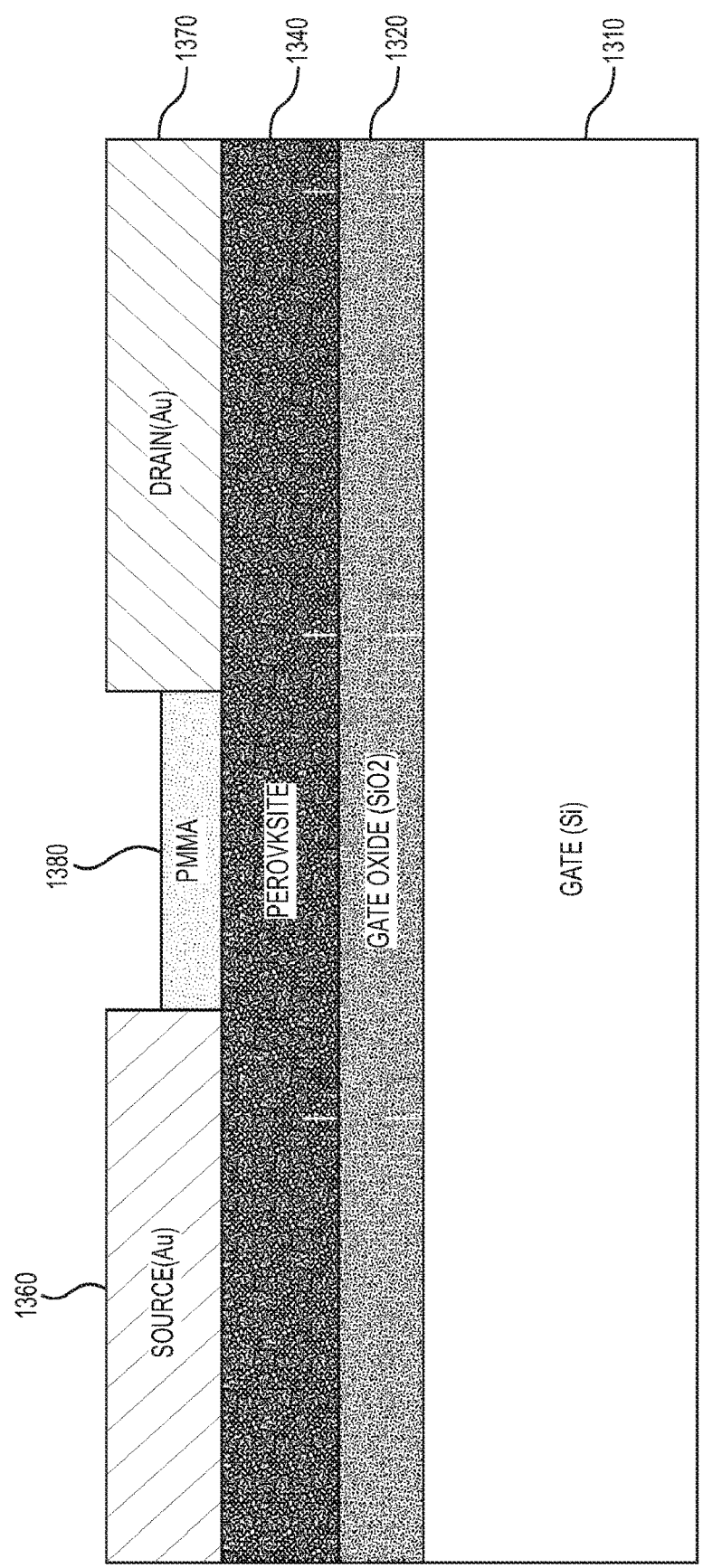
FIG. 13 illustrates an example hybrid organic-inorganic halide perovskite thin film light emitting transistor in accordance with one or more embodiments.

FIG. 13 illustrates an example hybrid organic-inorganic halide perovskite thin film light emitting transistor 1300. A hybrid organic-inorganic halide perovskite film layer fabricated by the methods described previously may be incorporated into the example device structure illustrated in FIG. 13. The light emitting transistor 1300 includes a gate 1310, a gate oxide layer 1320, a channel and light-emitting layer 1340, a capping layer 1380, a source 1360, and a drain 1370.

In one or more embodiments, the gate 1310 may be silicon and may have thickness of 50-200 nm. The gate oxide layer 1320, deposited onto the gate 1310, may be silicon dioxide ($SiO_2$) and may have thickness of 50-500 nm. The channel and light-emitting layer 1340 may be a hybrid organic-inorganic halide perovskite film, such as $CH_3NH_3PbI_{3-x}Cl_x$ thin film as described herein and may have thickness of 50-200 nm. The capping layer 1380 may be Poly(methyl methacrylate) (PMMA) and may have thickness of 20-100 nm. The source 1360 and the drain 1370 may be gold and may have thickness of 50-200 nm.

Figure 14A:
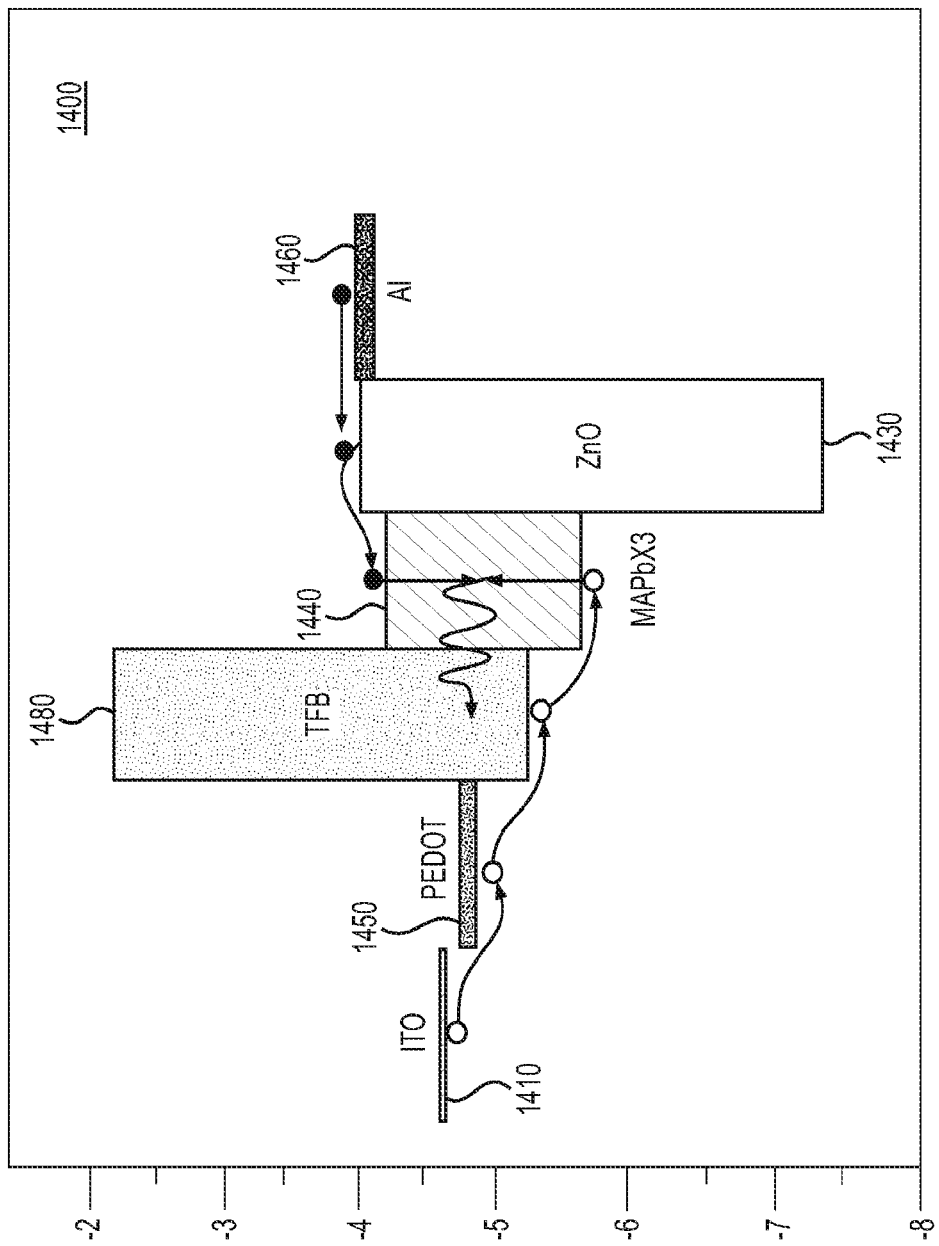
FIGS. 14(a) and 14(b) illustrate light emitting devices in accordance with one or more embodiments.

FIG. 14(a) illustrates an example hybrid organic-inorganic halide perovskite light emitting device 1400. A hybrid organic-inorganic halide perovskite film layer fabricated by the methods described previously may be incorporated into the example device structure illustrated in FIG. 14. The light emitting device 1400 includes a substrate 1410, a p-type hole injecting layer 1450, a light emitting layer 1440, an n-type electron injecting layer 1430, a hole-injecting material 1480 and a metal contact 1460.

In one or more embodiments, the substrate 1410 may be a transparent conductive layer the transparent conductive oxide (TCO), such as tin-doped indium oxide (TIO). The p-type hole injecting layer 1450 may be poly(3,4-ethylene-dioxythiophene) polystyrene sulfonate (PEDOT). The light emitting layer 1440 may be a hybrid organic-inorganic halide perovskite film, such as $CH_3NH_3PbI_{3-x}Cl_x$ thin film as described herein. The n-type electron injecting layer 1430 may be zinc oxide (ZnO). The hole-injecting material 1480 may be Poly[(9,9-dioctylfluorenyl-2,7-diyl)-co-(4,4'-(N-(4-sec-butylphenyl)diphenylamine)] (TFB). The metal contact 1460 may be Al. The open circles represent holes, and filled circles represent electrons. Such holes and electrons recombine in the light emitting layer 1440 and light is emitted.

Figure 14B:
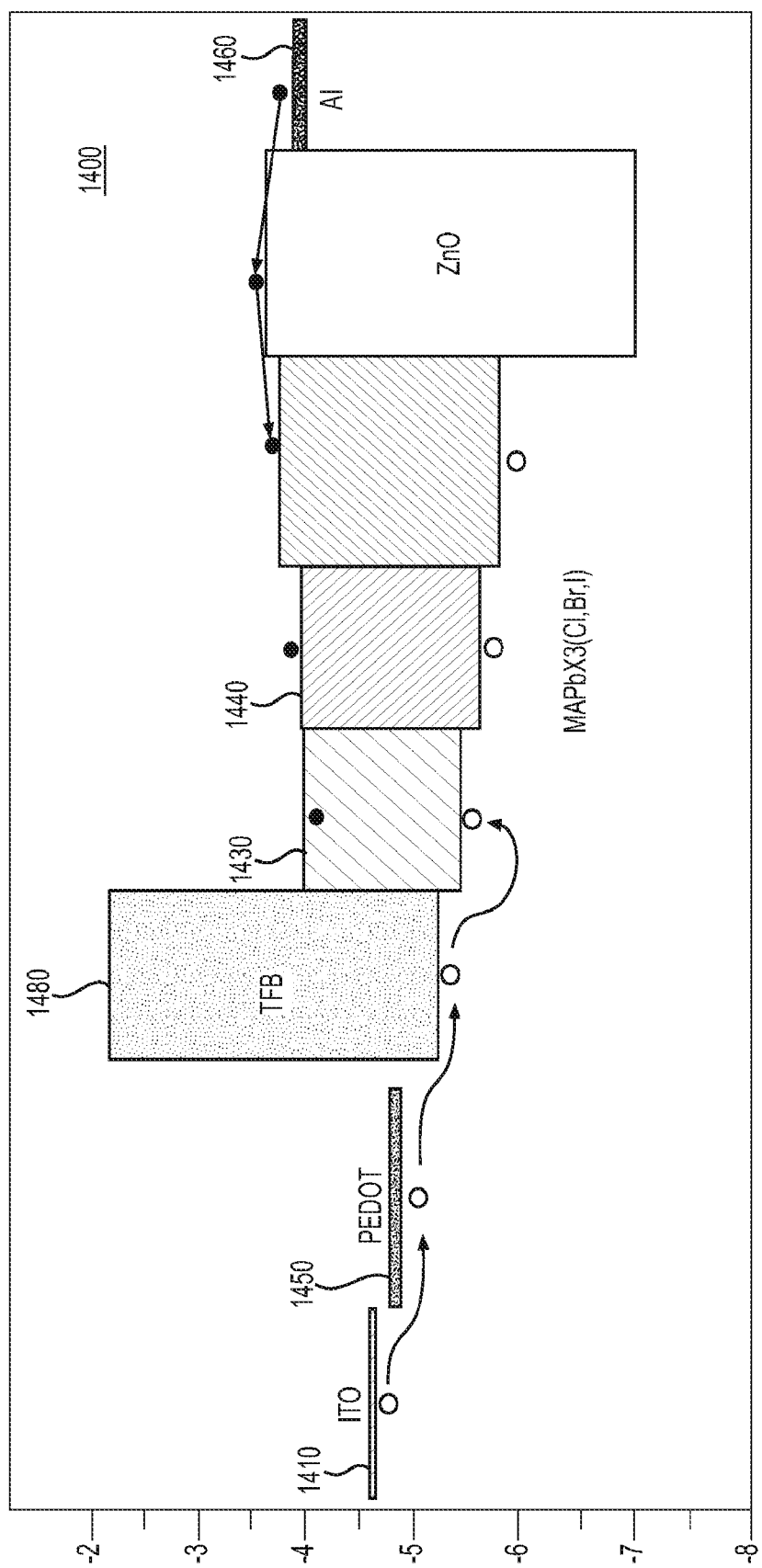

FIG. 14(b) illustrate another example hybrid organic-inorganic halide perovskite light emitting device including three light emitting layers 1440.

Observed Results

In one or more embodiments, the light-absorbing layer 1140 of the device stack 1100 may be a $CH_3NH_3PbI_{3-x}Cl_x$ thin film as described herein. The light-absorbing layer 1140 may also be another suitable material, such as $CH_3NH_3PbI_3$. The light-absorbing layer 1140 may be either a p-type or an n-type semiconductor layer. In one or more embodiments, the device stack 1100 may include multiple light-absorbing layers. Although this disclosure describes particular types of light-absorbing layers, the scope of the invention should not be considered limited to these particular types.

Figure 15:
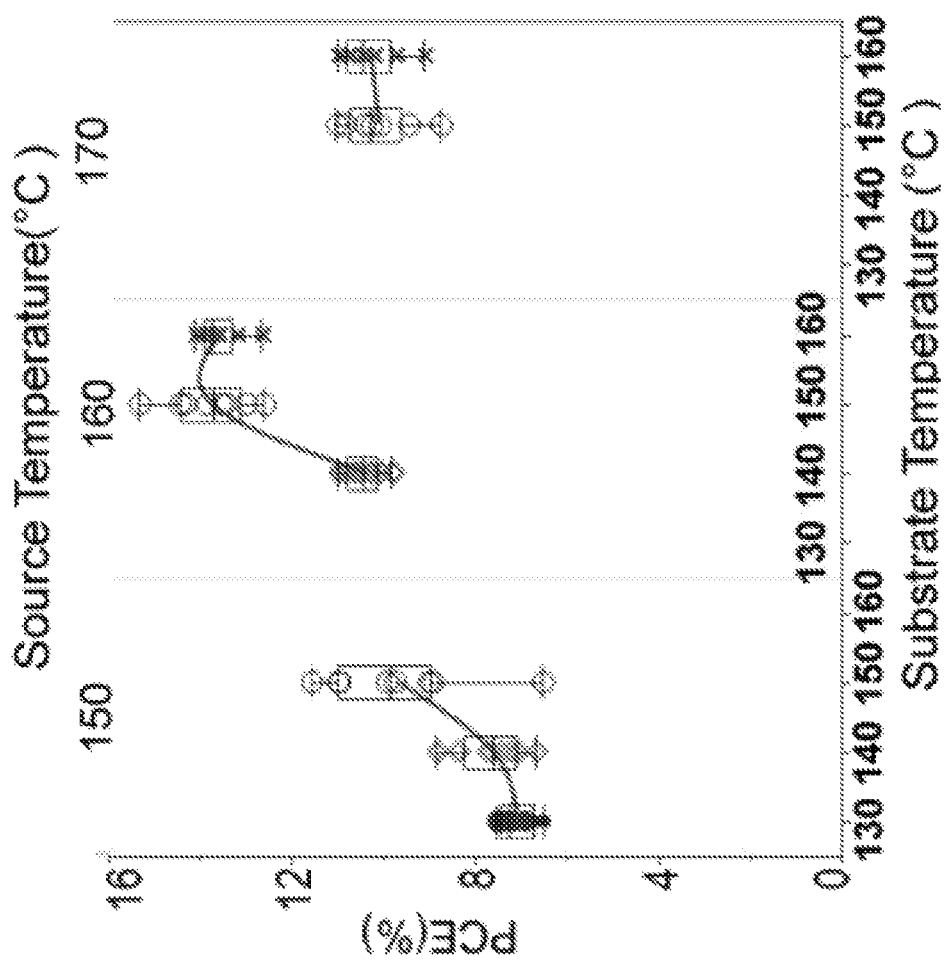
FIG. 15 illustrates a power conversion efficiency (PCE) measurement of hybrid organic-inorganic halide perovskite films in accordance with one or more embodiments.

FIG. 15 illustrates a power conversion efficiency (PCE) measurement of hybrid organic-inorganic halide perovskite films. The absorption coefficient achieved with the methods described previously was 14%, which is either comparable with or, in most cases, exceeds what is possible with other deposition and annealing methods.

The absorption efficiency may be influenced by the thermodynamic process of sublimation, inter-diffusion and crystallization in the CSS system 200 in accordance with one or more embodiments. As the crystallization occurs immediately after the organic source material and the metal halide are brought together, the nucleation and growth kinetics are very fast. Therefore, the sublimation and interdiffusion processes dominate in the fabrication process. FIG. 15 shows the PCE of the hybrid organic-inorganic halide perovskite films fabricated at various source temperatures and substrate temperatures. However, a pressure of the vacuum chamber of the system during the fabrication process, a separation between the precursor layer and the organic source-material layer may also affect the sublimation rate. The best absorption coefficient was shown in a film that was processed at a source temperature (i.e., temperature of the second heater for the organic source-material layer 210) of 160° C. and a substrate temperature (i.e., temperature of the first heater for the precursor layer 212) of 150° C. If the source temperature is too high (e.g., 170° C.), the sublimation rate is larger than the interdiffusion rate. Accordingly, a large number of organic molecules form on the surface, deteriorating the maximum power from open-circuit voltage Voc and fill factor (FF). The same is true when the substrate temperature is too low. In contrast, if the source temperature is too low, there is not enough organic vapor. Accordingly, the crystallization is not fully completed, resulting in a low cell short-circuit current Jsc.

As used herein, the term "open-circuit voltage" refers to the maximum voltage available from a solar cell, and this occurs at zero current.

As used herein, the term "short-circuit current" refers to the current through the solar cell when the voltage across the solar cell is zero, and this occurs when the solar cell is short circuited.

As used herein, the term "fill factor (FF)" refers to a parameter defined as the ratio of the maximum power from the solar cell to the product of Voc and Jsc.

Figure 16:
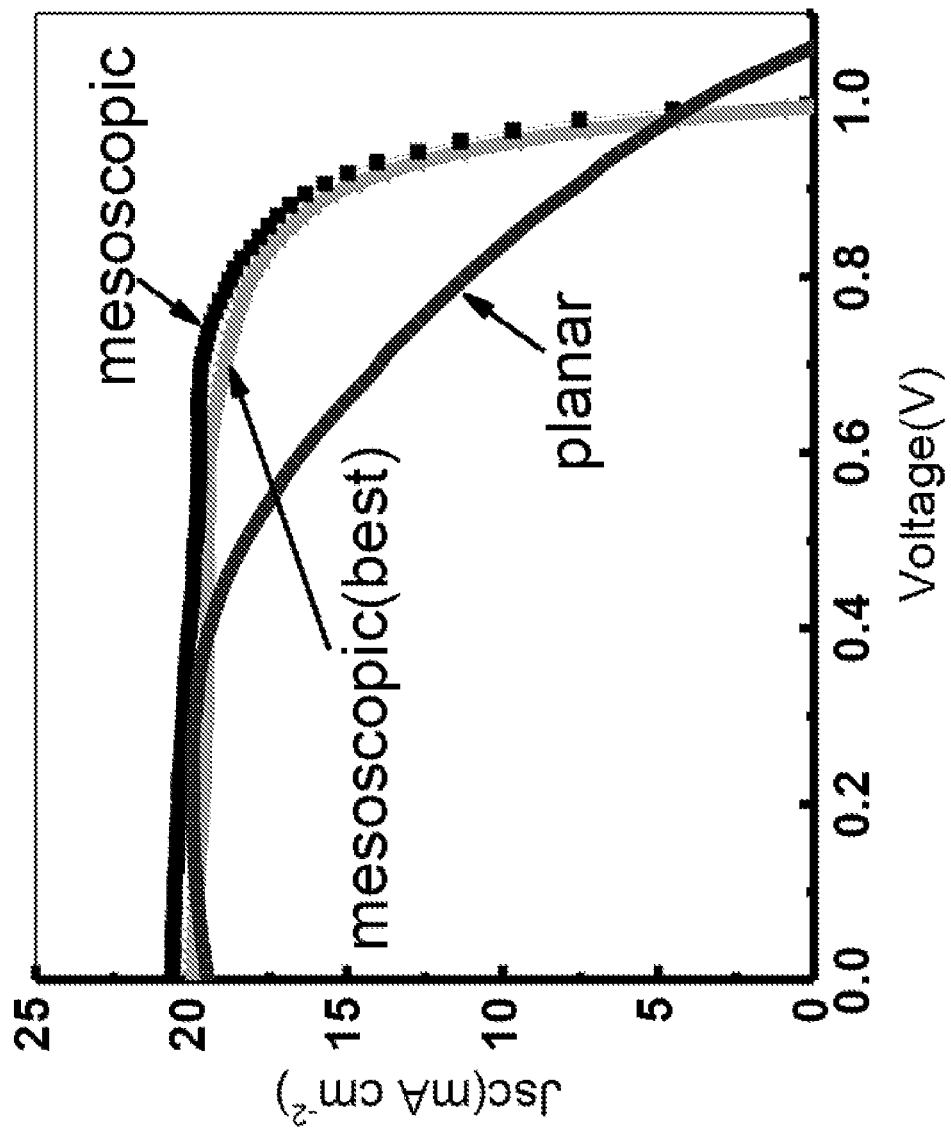
FIG. 16 illustrates a current-voltage (J-V) measurement of hybrid organic perovskite films in accordance with one or more embodiments.

FIG. 16 illustrates a current-voltage (J-V) measurement of hybrid organic perovskite films, fabricated at the source temperature of 160° C. and the substrate temperature of 150° C. The average efficiency achieved under standard AM1.5G conditions for a planar structured and a mesoscopic nano-structured cells were 11% and 14.6%, respectively.

As used herein, the air mass coefficient refers to the direct optical path length through the Earth's atmosphere, expressed as a ratio relative to the path length vertically upwards, i.e. at the zenith. The air mass coefficient is commonly used to characterize the performance of solar cells under standardized conditions, and is often referred to using the syntax "AM" followed by a number. "AM1.5" is almost universal when characterizing terrestrial power-generating panels.

The low FF of the planar cell may be attributed to slow charge collection kinetics at the interface between the c-$TiO_2$ layer 1130 and the light-absorbing layer 1140 and large series resistance in the light-absorbing layer 1140. The large resistance may be observed from the gentle slope of the J-V curve at the open-circuit voltage $V_{oc}$ suggesting the presence of resistance-related components in the light-absorbing layer 1140. The best cell (with c-$TiO_2$) shows $J_{sc}$ of 20.6 $mA/cm_2$, $V_{oc}$ of 1 V and FF of 0.745, with an absorption efficiency of 15.4%.

Figure 17:
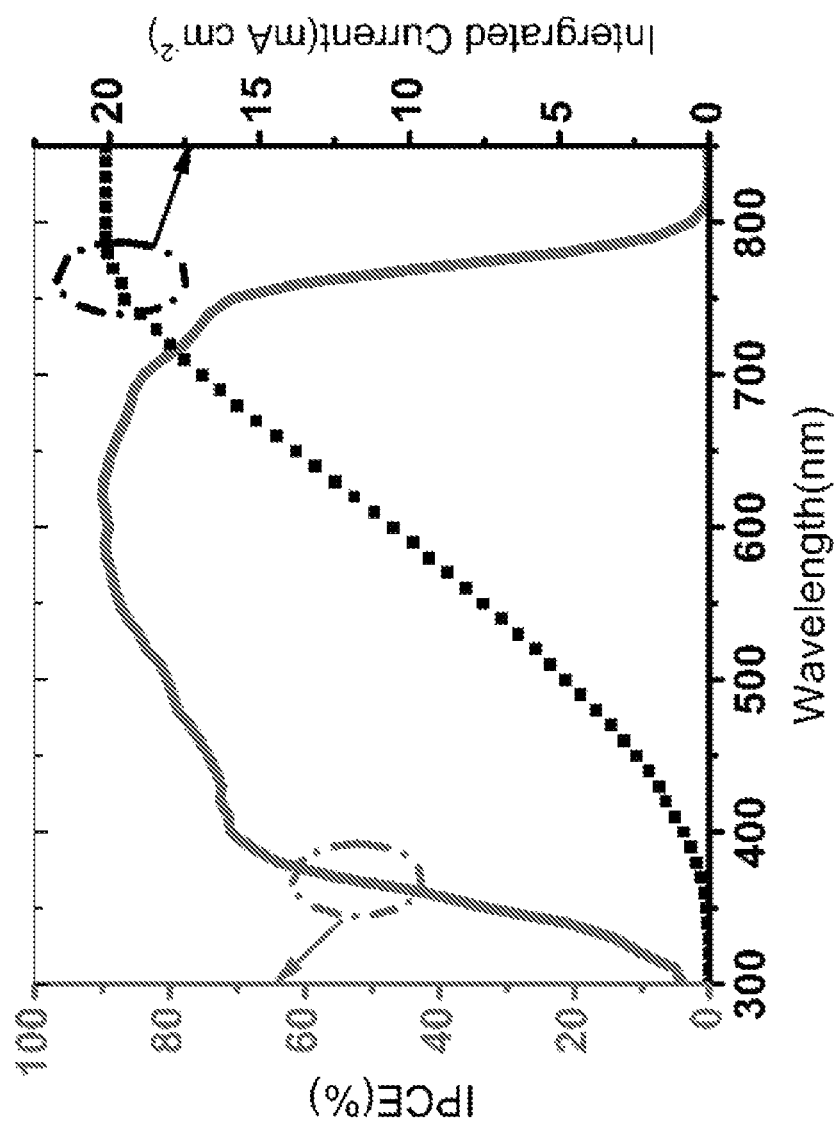
FIG. 17 illustrates an external quantum efficiency (EQE) and a cell short-circuit current $J_{sc}$ of a hybrid organic perovskite film in accordance with one or more embodiments.

FIG. 17 illustrates an external quantum efficiency (EQE) and the cell short-circuit current $J_{sc}$ obtained by integrating the external quantum efficiency the EQE. FIG. 17 shows Jsc of 19.9 $mA/cm^2$, which is in good agreement with $J_{sc}$ shown in FIG. 16.

Figure 18:
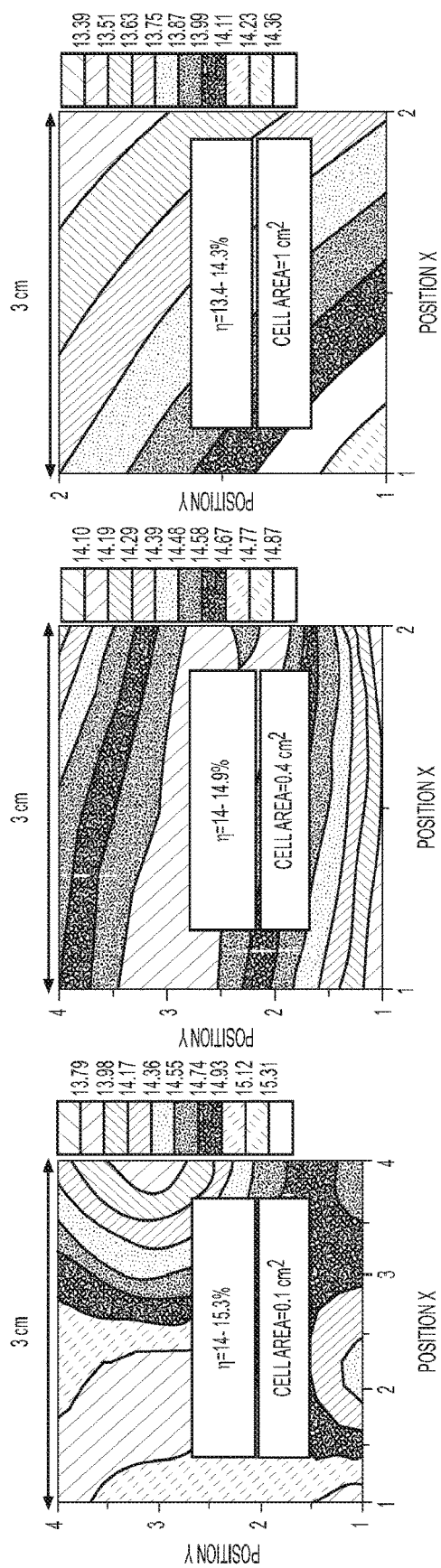
FIGS. 18(a) 18(b), and 18(c) illustrate uniformity of a solar cell device in accordance with one or more embodiments.

FIGS. 18(a), 18(b), and 18(c) illustrate uniformity of solar cell devices of area size 0.1 $cm^2$, 0.4 $cm^2$, and 1 $cm^2$, respectively, on a substrate grid of size 3 cm×3 cm. FIGS. 18(a), 18(b), and 18(c) show only negligible deviations of ±10% in the power conversion efficiency (PCE) over the 3 cm×3 cm substrate grid. Such uniformity may suggest the potential of the methods using the CSS system 200 described previously for large-area fabrication.

Figure 19:
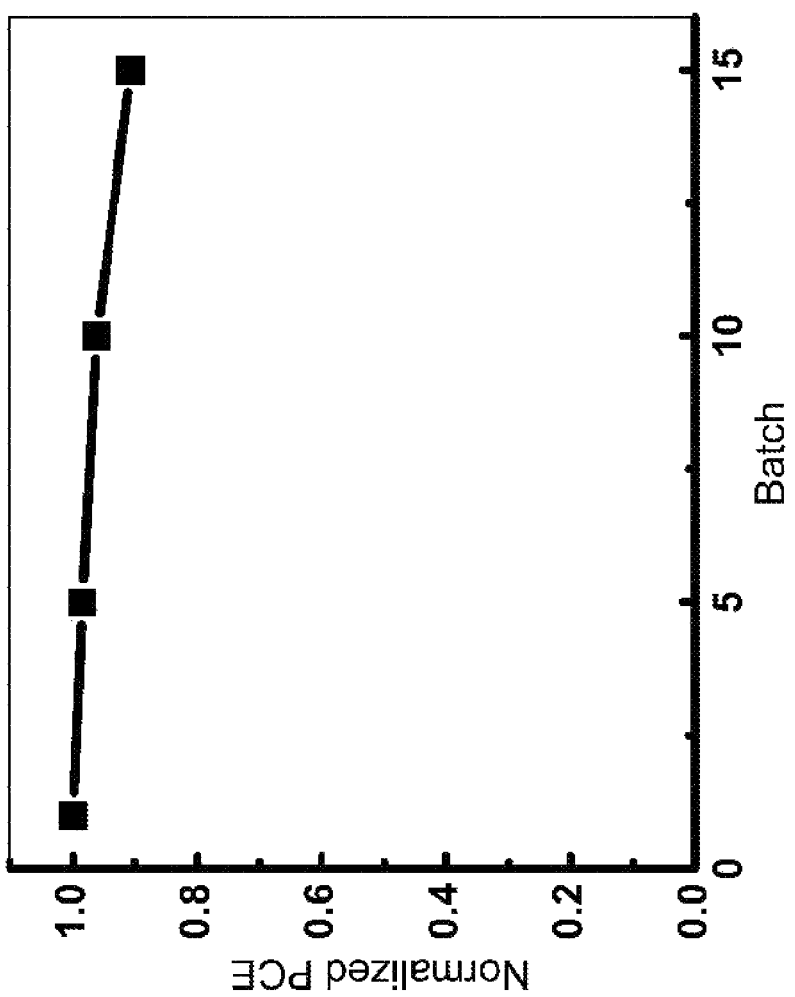
FIG. 19 illustrates a batch-to-batch variation of a power conversion efficiency (PCE) of a hybrid organic-inorganic halide perovskite film in accordance with one or more embodiments.

FIG. 19 illustrates a batch-to-batch variation of a power conversion efficiency (PCE) of a hybrid organic-inorganic halide perovskite film. The PCE is still 90% of the PCE for the first batch after 15 batches (i.e. 15 usages of the organic material source). The decrease in the PCE mainly arises as a result of exposure of the organic source materials to the air (humidity >65%) when the organic source materials are removed from the chamber of the CSS system 200 after every batch. This decrease may be effectively avoided by using a closed system without the exposure of the organic source materials in the air with high humidity. Since the cost of such organic source materials may be a determining factor for a practical large-scale fabrication, repeatable use of the organic source materials may increase the potential of the methods using the CSS system 200 described previously for large-area fabrication.

It is to be understood that the present invention is not limited to the embodiment and the example described above and illustrated herein, but encompasses any and all variations falling within the scope of the appended claims. For example, as is apparent from the claims and specification, not all method steps need be performed in the exact order illustrated or claimed, but rather in any order that allows the proper formation of the solar cells of the present invention.

While the invention has been described with respect to a limited number of embodiments, those skilled in the art, having benefit of this disclosure, will appreciate that other embodiments can be devised without departing from the scope of the invention as disclosed herein. Accordingly, the scope of the invention should be limited only by the attached claims.

What is claimed is:

1. A method of fabricating a hybrid organic-inorganic halide perovskite film, comprising:
    depositing a precursor layer onto a substrate, the precursor layer comprising metal halide;

placing an organic source-material layer onto a boat, the organic source-material layer comprising an organic cation; and annealing the precursor layer and the organic source-material layer in a vacuum chamber enclosed in a constrained volume, wherein the annealing is performed at a pressure of 2.5-700 Torr.

2. The method of claim 1, wherein the boat comprises aluminum, tungsten, graphite, or stainless steel, and the substrate comprises soda-line glass, flexible plastic substrates, or stainless steel.

3. The method of claim 1, wherein the metal halide comprises a divalent metal cation, selected from $Cu^+$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, and $Yb^{2+}$, and a halide anion, selected from I—, Br—, I—, NCS—, CN—, and NCO—.

4. The method of claim 1, wherein the organic caution is a monovalent or divalent organic cation, selected from $CH_3NH_3+$, $CH_3CH_2NH_3+$, $N(CH_3)_4+$, formamidinium $NH_2CHNH_2+$), and $C(NH_2)_3+$.

5. The method of claim 1, wherein during the step of annealing,
the temperature of the first heater is between 100 and 200° C.,
the temperature of the second heater is between 100-200° C.,
the time duration of the annealing is between 2 and 10 minutes.

6. The method of claim 1, wherein each of the first heater and the second heaters is connected to a proportional-integral-derivative (PID) temperature controller with K-type thermocouple.

7. The method of claim 1, wherein the boat and the substrate are separated by a distance between 0.5 and 10 mm.

8. The method of claim 1, wherein the fabricated hybrid organic-inorganic halide perovskite film is in a three-dimensional crystal structure.

9. The method of claim 1, wherein the fabricated hybrid organic-inorganic halide perovskite film is in a two-dimensional layered crystal structure.

10. A hybrid organic-inorganic halide perovskite solar cell device comprising:
a substrate;
a hole blocking layer;
a n-type semiconductor layer;
the hybrid organic-inorganic halide perovskite film fabricated according to the method of claim 1 as a light-absorbing layer;
a p-type semiconductor layer; and
a metal grid.

11. A hybrid organic-inorganic halide perovskite photodetector comprising:
a substrate;
a transparent conductive oxide (TCO) layer;
a p-type semiconductor layer;
the hybrid organic-inorganic halide perovskite film fabricated according to the method of claim 1 as a light absorbing layer;
a n-type semiconductor layer;
a hole blocking layer; and
a metal contact.

12. A hybrid organic-inorganic halide perovskite thin film light emitting transistor comprising:
a gate;
a gate oxide layer;
the hybrid organic-inorganic halide perovskite film fabricated according to the method of claim 1 as a channel and light-emitting layer;
a capping layer;
a source; and
a drain.

13. A hybrid organic-inorganic halide perovskite thin film light emitting device comprising:
a substrate;
a p-type hole injecting layer;
the hybrid organic-inorganic halide perovskite film fabricated according to the method of claim 1 as a light emitting layer;
an n-type electron injecting layer;
a hole-injecting material; and
a metal contact.

* * * * *